United States Patent
Twitto et al.

(10) Patent No.: US 10,387,254 B2
(45) Date of Patent: Aug. 20, 2019

(54) BOSE-CHAUDHURI-HOCQUENCHEM (BCH) ENCODING AND DECODING TAILORED FOR REDUNDANT ARRAY OF INEXPENSIVE DISKS (RAID)

(71) Applicant: SAMSUNG ELECTRONICS CO., LTD., Suwon-si, Gyeonggi-Do (KR)

(72) Inventors: Moshe Twitto, Ramat Gan (IL); Yaron Shany, Ramat Gan (IL); Avner Dor, Ramat Gan (IL); Elona Erez, Ramat Gan (IL); Jun Jin Kong, Yongin-si (KR)

(73) Assignee: SAMSUNG ELECTRONICS CO, LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/730,943

(22) Filed: Oct. 12, 2017

(65) Prior Publication Data
US 2019/0114228 A1   Apr. 18, 2019

(51) Int. Cl.
*G06F 11/10* (2006.01)
*G06F 3/06* (2006.01)
(Continued)

(52) U.S. Cl.
CPC ........ *G06F 11/1076* (2013.01); *G06F 3/0619* (2013.01); *G06F 11/1072* (2013.01); *H03M 13/1515* (2013.01); *H03M 13/29* (2013.01)

(58) Field of Classification Search
CPC .............. G06F 11/1076; G06F 3/0619; G06F 11/1072; H03M 13/1515; H03M 13/29
See application file for complete search history.

(56) References Cited

U.S. PATENT DOCUMENTS

| 7,484,165 B2 | 1/2009 | Griesser et al. |
| 7,688,908 B2 * | 3/2010 | Niu ........................ H03M 13/05 375/262 |

(Continued)

OTHER PUBLICATIONS

Ryan Gabrys, et al., "Graded Bit-Error-Correcting Codes With Applications to Flash Memory," IEEE Transactions on Information Theory, vol. 59, No. 4, Apr. 2013, pp. 2315-2327.

(Continued)

*Primary Examiner* — Kyle Vallecillo
(74) *Attorney, Agent, or Firm* — F. Chau & Associates, LLC

(57) ABSTRACT

A method of encoding generalized concatenated error-correcting codes includes providing a parity matrix $\tilde{H}_j$ of a j-th layer code and predefined syndrome $\tilde{s}$ of length $n-\tilde{k}_j$, where the first $n-k_j$ coordinates are zero, n is a length of a codeword c of a first layer BCH code $C_j$ of dimension $\tilde{k}_j$, codeword c satisfies $\tilde{H}_j c = \tilde{s}$, a first layer code includes only a BCH code, and each subsequent layer includes a Reed-Solomon (RS) stage followed by a BCH code; finding a square matrix R, of dimension $(n-\tilde{k}_j)(n-\tilde{k}_j)$ such that $R_j \tilde{H}_j = (A|I)$, where A is an arbitrary matrix, $R_j = (Q_j|T_j)$, where Q has $n-k_j$ columns $T_j$ and has $k_1 - \tilde{k}_j$ columns; finding a vector $c - (a\ b)$ where a is a vector of length $\tilde{k}_j$ and b is a vector of length $n-\tilde{k}_j$; and solving $$(A|I)\binom{a}{b} = (Q_j | T_j)\tilde{s} = T_j s \text{ where } a = 0 \text{ and } b = T_j s,$$

where $a=0$ and $b=T_j s$, and codeword c is nonzero only on the last $n-\tilde{k}_j = n-k_j$ bits.

6 Claims, 16 Drawing Sheets

(51) Int. Cl.
*H03M 13/15* (2006.01)
*H03M 13/29* (2006.01)

(56) References Cited

U.S. PATENT DOCUMENTS

| | | | | |
|---|---|---|---|---|
| 7,978,100 | B2 | 7/2011 | Yang et al. | |
| 8,111,670 | B2* | 2/2012 | Niu | H03M 13/15 |
| | | | | 370/335 |
| 2006/0114936 | A1* | 6/2006 | Paffen | H04W 28/14 |
| | | | | 370/469 |
| 2009/0040081 | A1* | 2/2009 | Yang | G06F 11/1068 |
| | | | | 341/94 |
| 2010/0306627 | A1* | 12/2010 | Sakai | H03M 13/1102 |
| | | | | 714/781 |
| 2011/0310978 | A1* | 12/2011 | Wu | H04N 19/44 |
| | | | | 375/240.25 |
| 2014/0126345 | A1* | 5/2014 | Ohana | H04L 1/0009 |
| | | | | 370/203 |
| 2016/0315733 | A1* | 10/2016 | Murakami | H04L 27/34 |
| 2018/0026661 | A1* | 1/2018 | Ha | G06F 11/1072 |
| | | | | 714/764 |

OTHER PUBLICATIONS

Hideki Imai, et al. "Generalized Product Codes," IEEE Transactions on Information Theory, vol. IT-27, No. 2, Mar. 1981, pp. 181-187.
Johannes Maucher, et al., "On the Equivalence of Generalized Concatenated Codes and Generalized Error Location Codes," IEEE Transactions on Information Theory, vol. 46, No. 2, Mar. 2000, pp. 642-649.

\* cited by examiner

BOSE-CHAUDHURI-HOCQUENCHEM (BCH) ENCODING AND DECODING TAILORED FOR REDUNDANT ARRAY OF INEXPENSIVE DISKS (RAID)

TECHNICAL FIELD

Embodiments of the present disclosure are directed to methods of forming error correcting codes.

DISCUSSION OF THE RELATED ART

In coding theory, BCH codes form a class of cyclic error-correcting codes that are constructed using finite fields. BCH codes are named for their inventors Raj Bose, D. K. Ray-Chaudhuri, and Alexis Hocquenghem. BCH codes can be defined as follows. Let GF(q) be a finite field, where g is a prime power, and choose positive integers m, n, d, c such that $2 \le d \le n$, gcd(n, q)=1, and m is the multiplicative order of q modulo n. Further, let a be a primitive nth root of unity in $GF(q^m)$, and let $m_i(x)$ be the minimal polynomial over GF(q) of $a^i$ for all i, The generator polynomial of the BCH code is the least common multiple g(x)=1 cm($m_c(x)$, ..., $m_{c+d-2}$(x)). BCH codes allow a precise control over the number of symbol errors correctable by the code during code design. In particular, it is possible to design binary BCH codes that can correct multiple bit errors. BCH codes can also be easily decoded using an algebraic method known as syndrome decoding. This can simplify the design of the decoder for these codes by using small, low-power electronic hardware.

The syndrome of a received codeword y=x+e, where x is the transmitted codeword and e is an error pattern, is defined in terms of the parity matrix H. The parity check matrix of a linear code C is a generator matrix of the dual code $C^\perp$, which means that a codeword c is in C iff the matrix-vector product Hc=0. Then, the syndrome of the received word y=x+e is defined as S=Hy=H(x+e)=Hx+He=0+He=He. Syndromes are useful in that the message polynomial drops out, and the length of S, the assumed number of errors L, is much less than the length of the codeword x itself.

The Berlekamp-Massey (BM) algorithm is an algorithm for decoding BCH codes that was originally developed to find the shortest linear feedback shift register (LFSR) for a given binary output sequence. The BM algorithm finds an error locator polynomial (ELP) $C(x)=1+C_1 x+C_2 x^2+ \ldots +C_L x^L$ which results in all syndromes being equal to 0: $S_n + C_1 S_{n-1} + \ldots + C_L S_{n-L} = 0$, where L is the number of assumed errors, N is the total number of syndromes, and n is an index that ranges from 0 to (N−1), and $L \le n \le N-1$.

The BM algorithm begins by initializing C(x) to 1, L to zero; B(x) (a copy of the last C(x) since L was updated) to 1, b (a copy of the last discrepancy d since L was updated and initialized) to 1; and m (the number of iterations since L, B(x), and b were updated and initialized) to 1. The algorithm iterates from n=0 to N−1. At each iteration k of the algorithm, a discrepancy d is calculated:

$$d = S_k + C_1 S_{k-1} + \ldots + C_L S_{k-L}.$$

If d is zero, C(x) and L are assumed correct for the moment, m is incremented, and the algorithm continues.

If d is not zero and 2L>n, C(x) is adjusted so that a recalculation of d would be zero:

$$C(x) = C(x) - (d/b) x^m B(x).$$

The $x^m$ term shifts B(x) to follow the syndromes corresponding to b. If the previous update of L occurred on iteration j, then m=k−j, and a recalculated discrepancy would be:

$$d = S_k + C_1 S_{k-1} + \ldots - (d/b)(S_j + B_1 S_{j-1} + \ldots).$$

This would change a recalculated discrepancy to: d=d−(d/b)b=d−d=0. Then, m is incremented, and the algorithm continues.

On the other hand, if d is not zero and $2L \le n$, a copy of C is saved in vector T, C(x) is adjusted as above, B is updated from T, L is reset to (n+1−L), the discrepancy d is saved as b, m is reset to 1, and the algorithm continues.

Hard information for a received bit is the estimated bit value, i.e., 0 or 1, while "soft information" includes both an estimated value and the reliability of this estimation. This reliability may take many forms, but one common form is the probability, or an estimation of this probability, that the estimation is correct. For example, in the case of a single-level cell (SLC) flash memory, in which each cell stores a single bit, hard information is obtained with a single read (single threshold), while increasingly refined soft information is obtained from additional reads.

In hard-decision (HD) decoding, the hard-information vector (per-coordinate bit estimates) is used as the input of an error-correcting code (ECC) decoder, while in soft-decision (SD) decoding, a soft information vector (per-coordinate reliability vector on top of the hard-information vector) is used as the input of the ECC decoder.

Thus, soft information may be regarded as an estimate of the reliability of each bit estimate, on top of the bit estimates themselves. Hence, bits with a high enough reliability may be considered "strong", while the remaining bits may be considered "weak". For example, in an SLC flash memory, one read, e.g., with threshold level h, results in the HD vector, while two additional reads, e.g., with thresholds h+Δ, h−Δ, may be used to divide bits into strong and weak bits.

An exemplary encoding/decoding is depicted in FIG. 1, in which a weak BCH code is given by $C_w \subseteq F_q^n$, the $k_w$ information bits are $x \in F_q^{k_w}$, and the parity check matrix of the weak BCH is $H_w \in F_q^{(n-k_w) \times n}$. A stronger BCH $C_s \subseteq F_q^n$ has parity check matrix $H_s \in F_q^{(n-k_s) \times n}$ given by:

$$H_s = \begin{pmatrix} H_w \\ H_d \end{pmatrix} \in F_q^{(n-k_s) \times n}, \quad (1)$$

where the number of rows of matrix $H_d$ is $(n-k_s)-(n-k_w) = k_w - k_s$, where the subscripts s, w, d respectively refer to strong, weal; and delta. The information data $x \in F_q^{k_w}$ can be encoded and decoded with the weak code and also with the strong code. Trivially, the information data can be encoded and decoded with the weak code $C_w \subseteq F_q^n$, and can be encoded and decoded with the strong code $C_s \subseteq F_q^n$, as described herein below.

Information data $x \in F_q^{k_w}$ can be encoded using a BCH code $C_w$ to obtain the codeword $c_y$, as illustrated in FIG. 2. The overhead of the strong code is given by $H_d c_w$ as shown in FIG. 2. This additional overhead may reside on a different page. Note that the overhead stored for a strong code according to an embodiment is not a conventional BCH overhead but $H_d c_w$ instead. However, the overall code is equivalent to a BCH code, as will be shown herein below. This overhead is protected by additional ECC, so that $H_d c_w$ is clean from errors.

A read of $c_w$ with errors yields:

$$y = c_w + e. \quad (2)$$

From y, the syndrome of the weak BCH can be computed:

$$H_w y = H_w e. \quad (3)$$

If the information can be decoded from syndrome, then the decoding is completed, otherwise, compute:

$$H_d y - H_d c_w = H_d c_w + H_d e - H_d c_w = H_d e, \quad (4)$$

since $H_d c_w$ was saved in a protected form. Thus there exist both $H_w e$ and $H_d e$ and therefore, from EQ. (1):

$$H_s e = \binom{H_w}{H_d} e \quad (5)$$

Thus, decoding can be performed using the stronger BCH $C_s$ with parity check matrix $H_s$.

Example

Let the error probability of weak BCH be given by $p=4.5\times10^{-3}$; the correction capability be $t=64$; and the BCH frame error rate (fer) be $q=bch\_fer(p, 2^{13}+64\times14, t, 1)$, i.e., a function of the bit error rate p, length $2^{13}+64\times14$, and error capability t. That is, the length of the BCH code is $n=2^{13}+64\times14$. Let, the error probability of the strong BCH is given by:

$$p=4.5\times10^{-3}; t_1=91; q_1=bch\_fer(p,2^{13}+64\times14,t1,1)$$

As in the weak BCH, the length of the BCH code is $n=2^{13}+64\times14$, but the correction capability is larger here and is determined by $t_1=91$.

Suppose that a weak BCH has error capability $t_w$ and a strong BCH has error capability $t_s$. Then the weak code uses the syndromes $H_w e$, and the strong BCH requires the syndromes of the weak BCH $H_w e$, as well as additional syndromes $H_d e$. The Berlekamp-Massey (BM) decoder works sequentially on the syndromes, that is, one syndrome after the other. Therefore, if a weak BCH fails, a decoding procedure of the strong BCH can resume from the same point. It will not be necessary to start decoding the strong BCH from the beginning, and it is therefore more efficient. In contrast, other decoding algorithms, such as Euclidian decoding, work simultaneously on all syndromes. Therefore, decoding of weak BCH and strong BCH codes is performed separately, and consequently will be more time consuming.

SUMMARY

Exemplary embodiments of the disclosure as described herein are directed to an encoding method for generalized concatenated codes tailored for using RAID on a function of a codeword, instead of on the codeword itself. According to embodiments of the disclosure, vectors are calculated with prescribed syndromes by using properties that the code is linear and cyclic, and using matrix manipulation of polynomials to find a systematic encoder that saves computations and required memory.

According to an embodiment of the disclosure, there is provided a computer implemented method of encoding generalized concatenated error-correcting codes, including receiving a codeword $\tilde{C}_j$ comprising $n_r$ rows, wherein $n_r \geq 1$, of n bits each with $k_M$ information bits, $k_M < n$, $n \geq 1$, wherein codeword $\tilde{C}_j$ is a code with parity check matrix $$\tilde{H}_j = \begin{pmatrix} H_1 \\ \tilde{\Delta}_{21} \\ \tilde{\Delta}_{32} \\ \vdots \\ \tilde{\Delta}_{j-1,j} \end{pmatrix}$$

wherein matrix $H_1$ is the parity check matrix of code $C_1$, matrix $$\tilde{\Delta}_{j-1,j} = \begin{pmatrix} \Delta_{j-1,j} \\ ext_j \end{pmatrix},$$

where $\tilde{\Delta} t_{j-1,j}$ has $L_j$ rows and $ext_j$ has $L_j - \delta_j$ rows, and matrix $\Delta_{j-1,j}$ represents the additional checks for codewords in $C_j$ that are not in $C_{j-1}$ and has $\delta_j$ rows; partitioning the $k_M$ information bits into n, blocks, wherein each layer comprises $k_{j+1}^{RS} - k_j^{RS}$ blocks of $\tilde{k}_j$ bits each for $j=2, \ldots, L$, wherein L is a number of layers of weak BCH code $C_1$, wherein each layer, except for a first layer, comprises a Reed Solomon (RS) stage followed by a BCH code, and the first layer includes only a BCH code, and $\tilde{k}_j$ is a dimension of codeword $\tilde{C}_j$; encoding a first $k_2^{RS}$ blocks with a with code $C_1$ and computing syndromes $S_{ij} = \tilde{\Delta} S_j(x_i)$ wherein a vector of syndromes $$(S_{12}, \ldots, S_{k_2^{RS},2})$$

is information encoded by Reed Solomon code $RS_2$, wherein a resulting $RS_2$ codeword is given by $$(S_{12}, \ldots, S_{k_2^{RS},2}, S_{k_2^{RS}+1,2}, \ldots, S_{n_r,2});$$

transforming information blocks of size $\tilde{k}_j$, for $j=2, \ldots, L$ and $i \in \{k_j^{RS}+1, \ldots, k_{j+1}^{RS}\}$ into blocks $u_i$, $i=1$ to $n_r$, of size $k_j$ using zero padding in coordinates specified by unit vectors; encoding block $u_i$ with an encoder for C to compute codeword $x_i$; calculating a vector b of length $n-\tilde{k}_j$ from $$b = T_j \begin{pmatrix} S_{i2} \\ \vdots \\ S_{ij} \end{pmatrix},$$

wherein matrix $T_j$ is defined by $R_j = (Q_j | T_j)$, where Q has $n-k_j$ columns, $T_j$ has $k_1 - \tilde{k}_j$ columns, and $R_j$ is a square matrix of dimension $(n-\tilde{k}_j)(n-\tilde{k}_j)$ such that $R_j \tilde{H}_j = (A|I)$, wherein A is an arbitrary matrix, I is an identity matrix, $\tilde{H}_j$ is a parity matrix of codeword $\tilde{C}_j$; updating codeword $x_i$ according to $$x_i \leftarrow x_i + \begin{pmatrix} 0 \\ \vdots \\ 0 \\ b \end{pmatrix} = \begin{pmatrix} x_1 \\ \vdots \\ x_{\tilde{k}_j} \\ x_{\tilde{k}_j+1} \\ \vdots \\ x_n \end{pmatrix} + \begin{pmatrix} 0 \\ \vdots \\ 0 \\ b_1 \\ \vdots \\ b_{n-\tilde{k}_j} \end{pmatrix};$$

and computing syndromes $S_{i,j'} = \tilde{\Delta} S_{j'}(x_i)$ for $j'=j+1, \ldots, L$, wherein a resulting $RS_{j+1}$ codeword is given by $$\left(S_{1,j+1}, \ldots, S_{k^{RS}_{j+1},j+1} S_{k^{RS}_{j+1}+1,j+1}, \ldots, S_{n_r,j+1}\right) \text{ for } j <= L-1.$$

for $j<=L-1$.

According to a further embodiment of the disclosure, the method includes, if parity matrix $\tilde{H}_j$ is not a full rank matrix, calculating a full rank parity matrix $H'_j$ from one of $\tilde{H}_j$ if a degree of a minimum polynomial for each element is m, wherein m is defined from a length n of a primitive binary BCH code associated with said parity matrix $\tilde{H}_j$ by $n=2^{m-1}$, and $H'_j$ with $\text{rank}(H_1)=\text{deg}(P_{\alpha^i})$ rows if the degree of the minimal polynomial is less than m, wherein $P_{\alpha^i}(x)$ is the minimal polynomial of $\alpha^1$ over the binary field and a generator polynomial of $\tilde{H}_j$ is $g_1(x)=\text{LCM}(P_{\alpha^i}(x)|i\in I)$.

According to an embodiment of the disclosure, there is provided a computer implemented method of encoding generalized concatenated error-correcting codes, including providing a parity matrix $\tilde{H}_j$ of a j-th layer code and predefined syndrome $\tilde{s}$, wherein syndrome g is a vector $$\tilde{s} = \begin{pmatrix} 0 \\ s \end{pmatrix}$$

of length $n-\tilde{k}_j$, in which the first $n-\tilde{k}_j$ coordinates are zero, wherein s is a vector of length $k_1-\tilde{k}_j$, wherein n is a length of a codeword c of a first layer BCH code $C_l$ of dimension $\tilde{k}_j$, wherein codeword c satisfies $\tilde{H}_j c = \tilde{s}$, wherein a first layer code includes only a BCH code, and each subsequent layer includes a Reed-Solomon (RS) stage followed by a BCH code; finding a square matrix $R_j$ of dimension $(n-\tilde{k}_j)(n-\tilde{k}_j)$ such that $R_j \tilde{H}_j = (A|I)$, wherein A is an arbitrary matrix and I is the identity matrix, wherein $R_j = (Q_j|T_j)$, where Q has $n-k_l$ columns and $T_j$ has $k_1-\tilde{k}_j$ columns; finding a vector $c=(a\ b)$ wherein a is a vector of length $\tilde{k}_j$ and b is a vector of length $n-\tilde{k}_j$; and solving $$(A|I)\begin{pmatrix} a \\ b \end{pmatrix} = (Q_j|T_j)\tilde{s} = T_j s \text{ wherein } a = 0 \text{ and } b = T_j s,$$

wherein $a=0$ and $b=T_j s$, wherein codeword c is nonzero only on the last $n-\tilde{k}_j=n-k_j$ bits.

According to an embodiment of the disclosure, there is provided a computer processor configured to execute a program of instructions to perform the method steps for encoding generalized concatenated error-correcting codes, wherein the computer processor is one or more of an application specific integrated circuit (ASIC), a field programmable gate array (FPGA), or firmware.

DETAILED DESCRIPTION OF EXEMPLARY EMBODIMENTS

Figure 1:
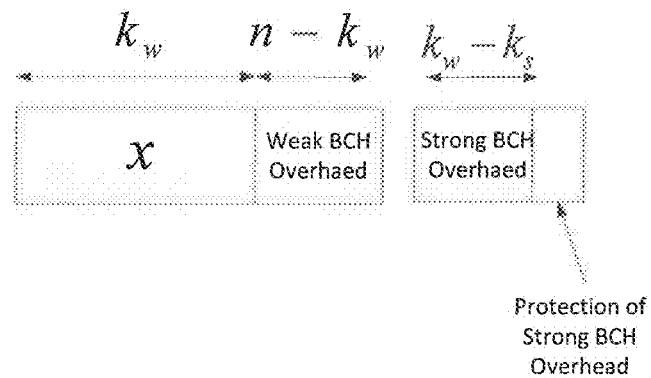
FIG. 1 depicts an exemplary encoding/decoding of a weak BCH code, according to an embodiment of the disclosure.
Figure 2:
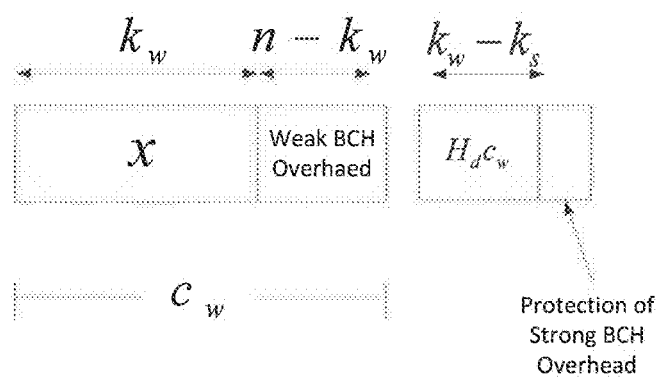
FIG. 2 illustrates how information data can be encoded using a BCH code to obtain a codeword $c_{x_i}$, according to an embodiment of the disclosure.

Exemplary embodiments of the invention as described herein generally provide systems and methods for encoding and decoding BCH codes tailored for a RAID. While embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

According to embodiments of the disclosure, there is provided a new projected BCH coding scheme that achieves superior performance relative to standard BCH code. According to an embodiment, instead of using RAID on an entire codeword, RAID is used only on a function of the codeword. This function, because it is also linear, is referred to hereinbelow as a projection. For a projected BCH according to an embodiment for a double-layered case; embodiments assume there is a weak BCH code $C_w$ and a strong BCH code $C_s$. These codes will be referred to herein below as $C_1$ and $C_2$, respectively. According to embodiments, the condition $C_1 \supset C_2$ holds, that is, every codeword of the strong code $C_2$ is also a codeword of the weak code $C_1$.

Figure 3:
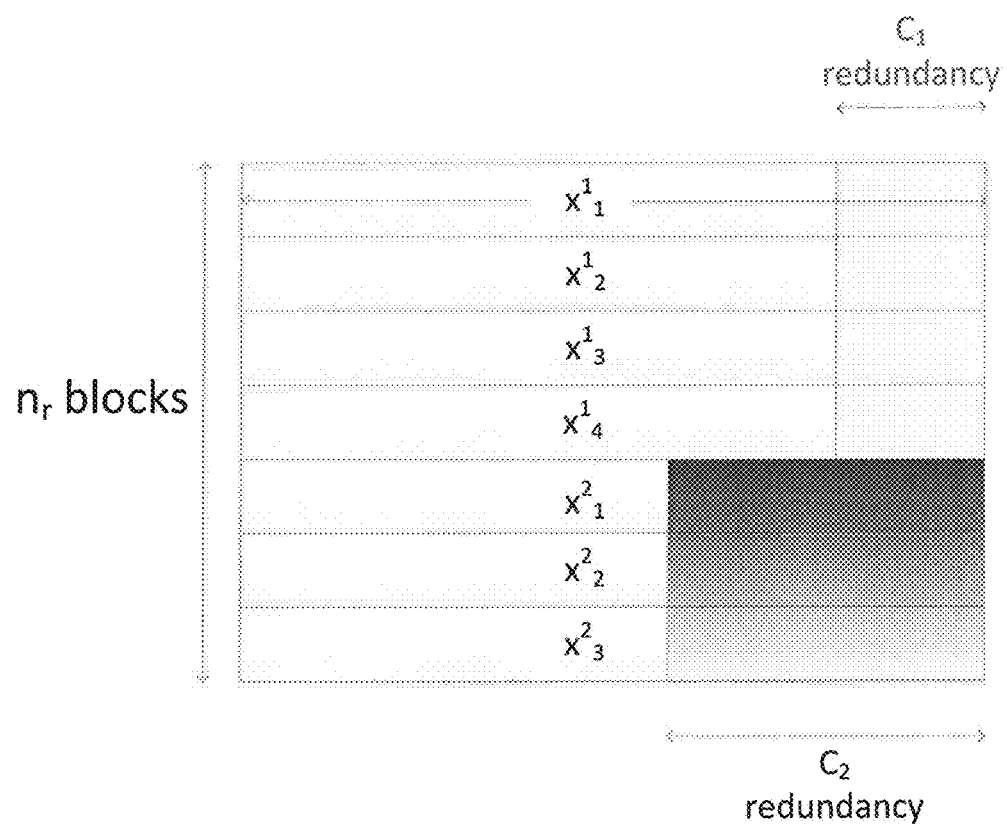
FIG. 3 illustrates how N bits of information to code can be distributed among $n_r$ blocks, according to an embodiment of the disclosure.

According to an embodiment, suppose there are N bits of information to code. These bits can be distributed among $n_r$ blocks, as illustrated in FIG. 3. In FIG. 3, $x^1_1$-$x^1_4$ are codewords of length n of a weak BCH code $C_1$ and $x^2_1$-$x^2_3$ are codewords of length n of strong code $C_2$. For code $C_1(n, k_1, d_1)$ and $C_2(n, k_2, d_2)$, $k_1 > k_2$ and $d_1 <= d_2$. In these codes, n is the length of the code, $k_i$ is the dimension of the code, and $d_i$ is the minimal distance. The parity checks matrices of $C_1$ and $C_2$ are $H_1$ and $H_2$, respectively. The parity check matrix $H_2$ of the stronger code can be written as a concatenation of $H_1$ and another matrix $H_\Delta$:

$$H_2 = \begin{pmatrix} H_1 \\ H_\Delta \end{pmatrix}.$$

Figure 4:
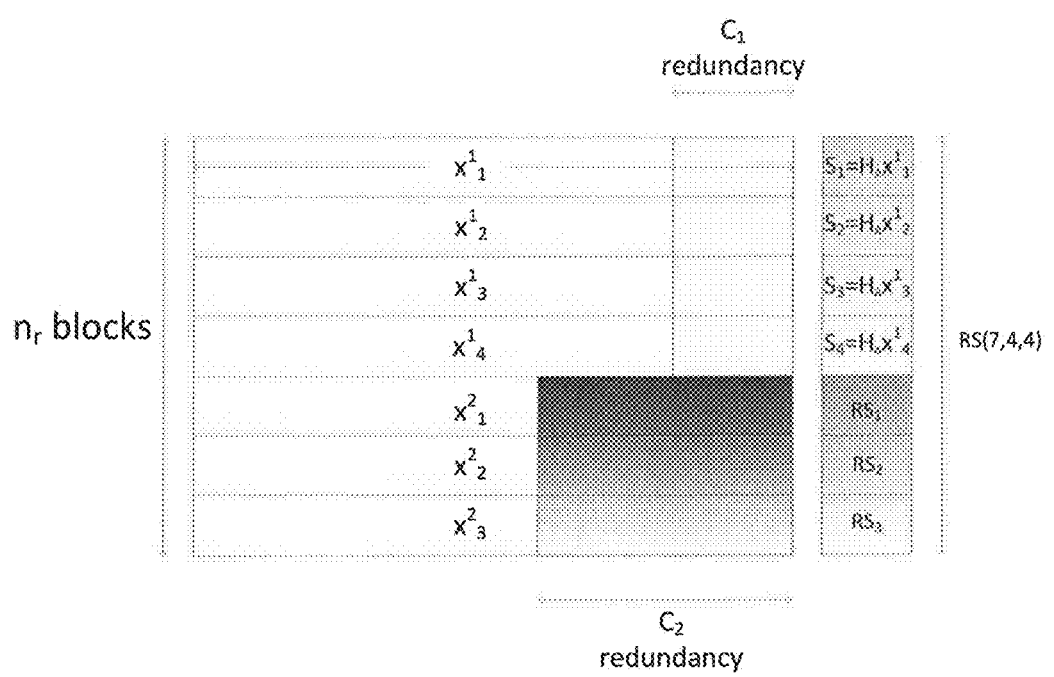
FIG. 4 illustrates syndromes, according to an embodiment of the disclosure.

According to embodiments, continuing with the example of FIG. 3, since $x^1_1$-$x^1_4$ are codewords of $C_1$, an encoder can compute their syndromes based on Ha. As shown in FIG. 4, the syndromes are given by $$S_i = H_\Delta x^1_i, i=1, \ldots, 4.$$

If the $x^2_1$-$x^2_3$ syndrome is computer based on $H_\Delta$, the result is the zero vector, since these are codewords of the strong code $C_2$, so these are not computed at the encoder. According to embodiments, the encoder can be any standard encoder as is known in the art, such as a BCH encoder or an RS encoder.

However, according to embodiments, the syndromes $S_i$ can be treated as symbols that are encoded using RS codes. In the example of FIG. 3, use RS (n=7, k=4, d=4). The RS redundancy symbols are denoted in the figure by $RS_1$, $RS_2$, $RS_3$. The symbols of the RS code are not explicitly stored by the encoder. Instead, the encoder finds a codeword $w_i$ of the code $C_1$, that has $RS_i$, i=1, 2, 3 as its syndrome according to $H_\Delta$:

$$H_\Delta w_i = RS_i, i=1,2,3.$$

Figure 5:
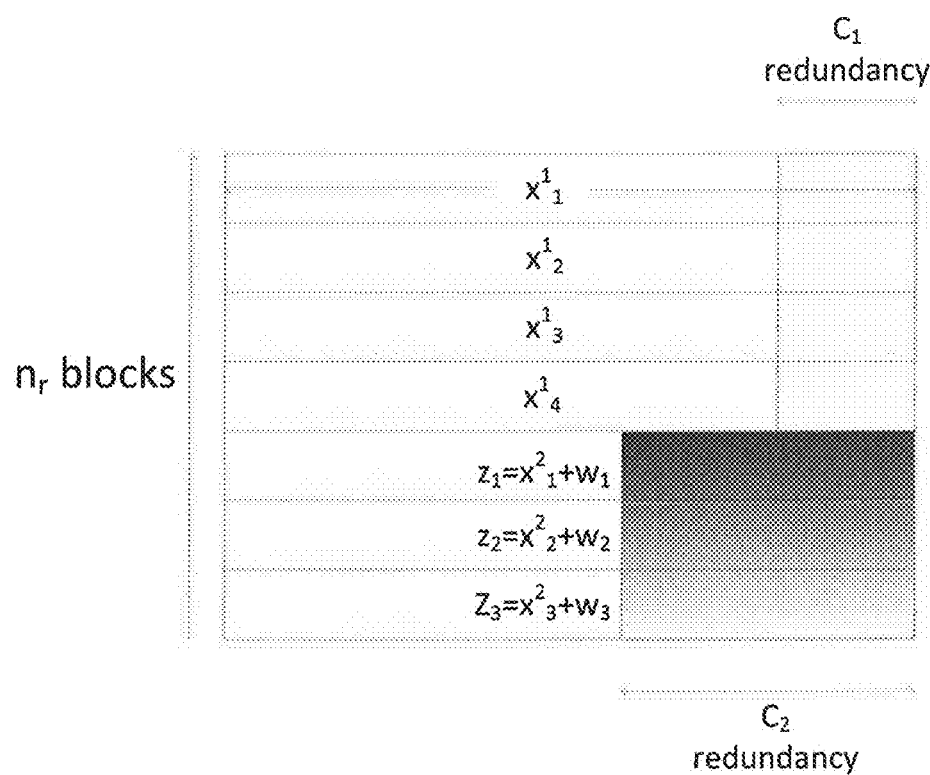
FIG. 5 illustrates how an encoder computes and stores codewords, according to an embodiment of the disclosure.

It will be shown below it is always possible to find $w_i$. For now, embodiments assume there is a simple lookup table that maps each syndrome into a codeword. The encoder computes and stores, shown in FIG. 5:

$$z_1 = x^2_1 + w_1.$$

$$z_2 = x^2_2 + w_2.$$

$$z_3 = x^2_3 + w_3.$$

Because both $x^2_1$ and $w_1$ are codewords of $C_1$, so is $z_1$. Similarly, so are $z_2$ and $z_3$.

At the output of the BSC channel, each codeword has noise added to it. A decoder according to an embodiment starts by attempting to decode the codewords of $C_1$: $x^1_1$-$x^1_4$, $z_1$-$z_3$. If at least 4 of the decoding attempts successful, then the RS stage will succeed. For codewords $x^1_1$-$x^1_4$: if decoding succeeds, then the syndromes $S_i = H_\Delta x^1_i$ can be computed and used to decode RS. For codeword $z_1$-$z_3$: if decoding succeeds, then the syndromes $S_i = H_\Delta z_i$, i=1, 2, 3 can be computed. Since $x^2_1$-$x^2_3$, are codewords of $C_2$ then $H_\Delta x^2_i = 0$, i=1, 2, 3. It follows that $H_\Delta z_i = H_\Delta w_i$, i=1, 2, 3. Thus, given the syndrome, the codeword $w_i$ can be found in $C_1$. This can be carried out by a lookup table that maps any given syndrome into a codeword of $C_1$. The codeword $w_i$ can be subtracted from z, to obtain the codeword $x^2_i$. The syndrome $H_\Delta z_i = H_\Delta w_i$ can be used for the RS decoding.

If at least 4 codewords were successfully decoded, the RS can be successfully decoded. However, according to an embodiment, if codeword $x^1_1$-$x^1_4$ are not successfully decoded at the first layer, the syndrome $H_\Delta x_i$ that was decoded using the RS decoding can be used to decode it using the stronger code $C_2$. The syndrome can be used for syndrome decoding, in a similar manner to what was described above for a projected BCH according to an embodiment. In addition, if codeword $z_1$-$z_3$ was not successfully decoded at the first layer, the syndrome $H_\Delta w_i$ that was decoded using the RS decoding can be used to find w, using a lookup table. Then, the $w_i$ can be subtracted from $z_i + e^2_i$, where $e^2_i$ is the noise added to the respective codeword, to obtain $x^2_i + e^2_i$, which can be decodes to find $x^2_i$ using a decoder according to an embodiment for the strong code, since $x^2_i$ is a codeword of $C_2$.

Figure 6:
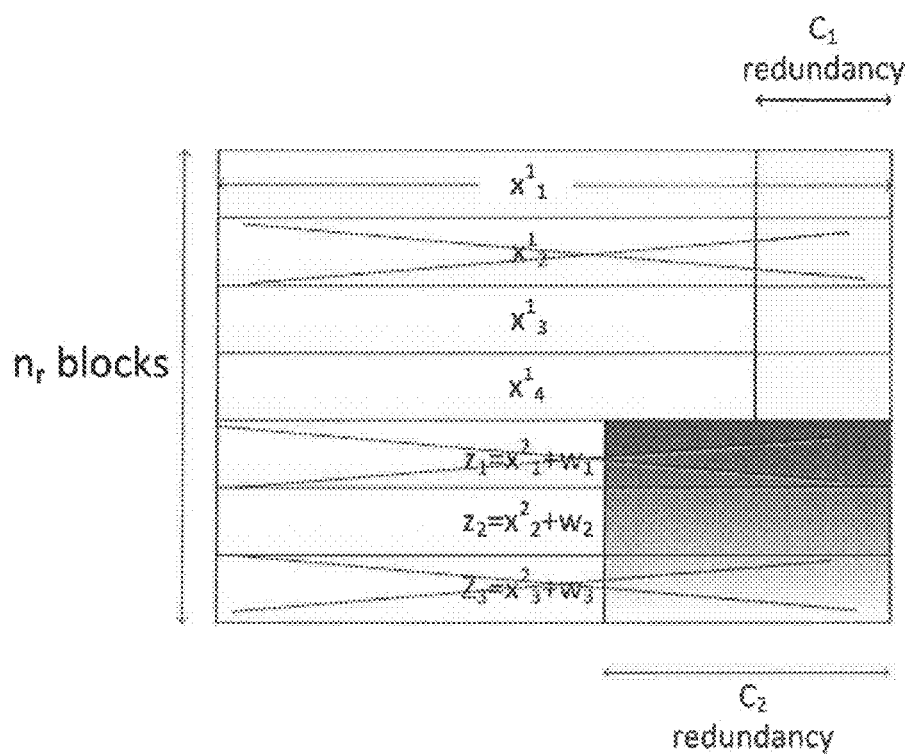
FIG. 6 illustrates decodings that failed, according to an embodiment of the disclosure.
Figure 7:
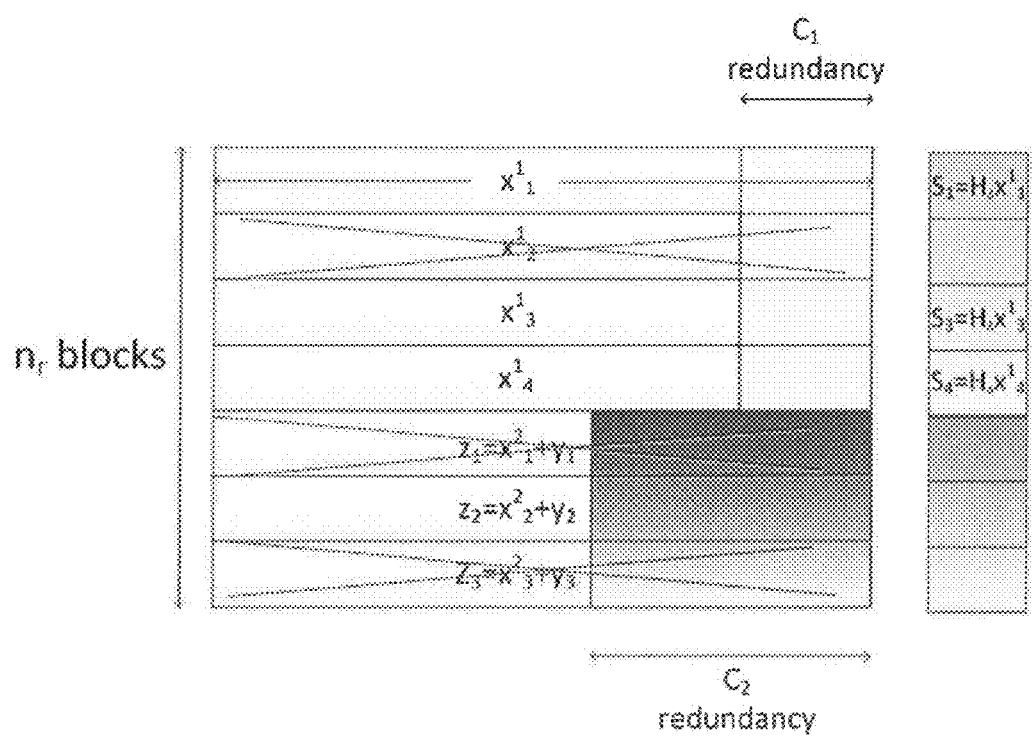
FIG. 7 illustrates the computing of syndromes for successfully decoded codewords, according to an embodiment of the disclosure.
Figure 8:
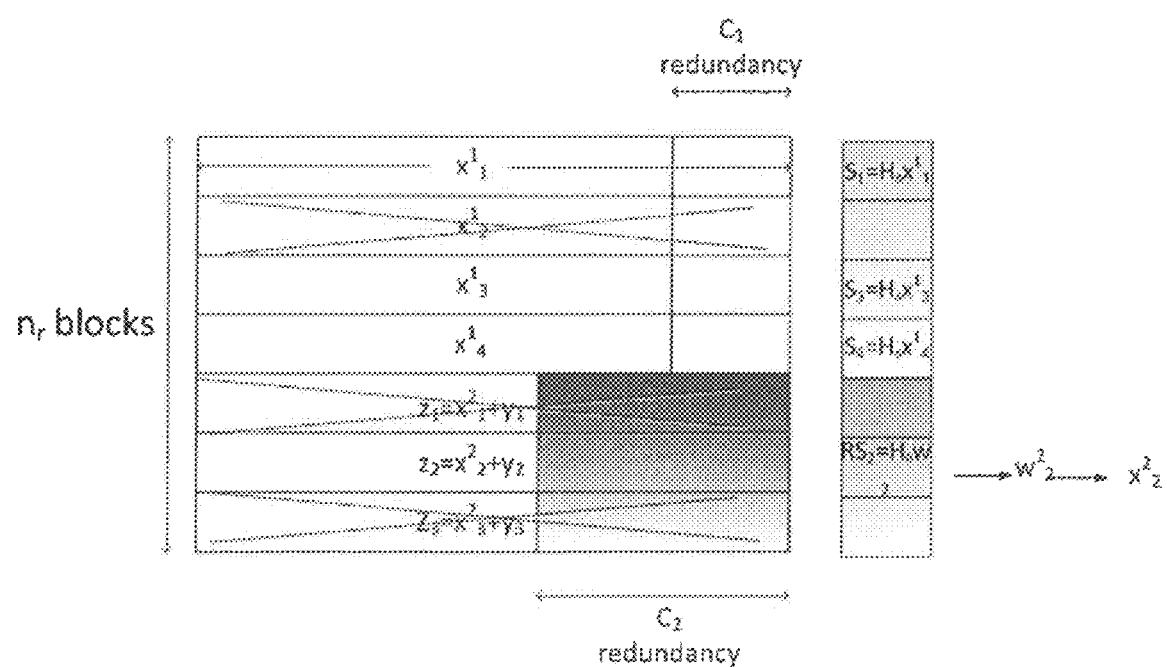
FIG. 8 illustrates the computation of the syndrome for a successfully decoded codeword, according to an embodiment of the disclosure.
Figure 9:
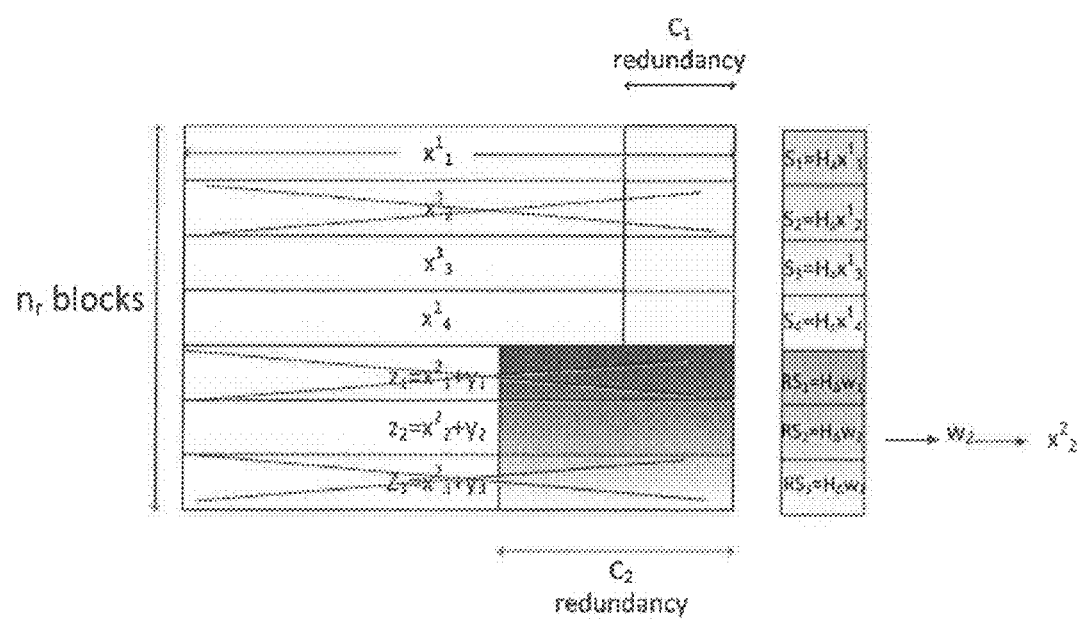
FIG. 9 illustrates how a codeword can be found from the syndrome, according to an embodiment of the disclosure.

For example, referring to FIG. 6, after first decoding all codewords with code $C_1$, assume that the decoding of $x^1_2$, $z_1$, $z_3$, fail. These are crossed out in the figure. For the successfully decoded codewords $x^1_1$, $x^1_3$ and $x^1_4$, the syndrome $S_i = H_\Delta x^1_i$, i=1, 3, 4 can be computed, as shown in FIG. 7. For the successfully decoded $z_2$, the syndrome $H_\Delta w_2 = RS_2$ can be computed, as shown in FIG. 8. From the syndrome $H_\Delta w_2 = RS_2$, $w_2$ can be found and subtracted from $z_2$ to get $x^2_2$, as shown in FIG. 9. The RS code can be used to obtain all the missing syndromes. Decoding $x^2_1$ can be attempted using syndrome decoding with code $C_2$. $w_1$ and $w_3$ can be found from $RS_1$ and $RS_3$, respectively: $w_i$ can be subtracted from $z_i + e^2_i$, i=1, 3, and $x^2_i x^2_i$ can be decoded using a decoder for $C_2$.

Multi-Layer BCH Encoding/Decoding: Preliminaries

Further embodiments of the disclosure provide a general multi-layer scheme for BCH encoding/decoding. According to embodiment, the following notations and preliminaries will be defined as follows.

L is the number of layers;

Each layer, except the first one, is composed of an RS stage followed by the BCH code;

The first layer includes only a BCH code;

n is the length of each block;

$n_r$ is the number of blocks;

Layer j is associated with the BCH code $C_j$;

$\{C_i\}$ is a set of binary linear codes of length n that maintain $C_1 \supset C_2 \ldots \supset C_L$, i.e., $C_1$ is the weakest code;

$d_j$ is the minimum distance of code $c_j$, where the codes maintain: $d_1 \leq d_2 \leq \ldots \leq d_L$ $k_j$ is the dimension of code $C_j$;

$$t_j = \left\lfloor \frac{d_j - 1}{2} \right\rfloor$$

is the correction capability of code $C_j$;

$\delta_j = k_{j-1} = k_j$ is the difference between dimensions;

The parity check matrix of code $C_j$ can be written in the form $$H_j = \begin{pmatrix} H_1 \\ \Delta_{21} \\ \Delta_{32} \\ \vdots \\ \Delta_{j,j-1} \end{pmatrix},$$

where $H_1$ is the parity check matrix of code $C_1$;

The matrix $\Delta_{21}$ represents the additional checks for codewords in $C_2$ that are not in $C_1$;

the parity check matrix is assumed to be full rank; and the delta syndrome of a binary vector x of length n is defined as $\Delta S_j(x) = \Delta m_{j,j-1} \cdot x$.

According to embodiments, for RS codes, the following preliminaries apply.

For layer j, j=2, ..., L, there is also an RS code. The RS code is not necessarily binary, and may be shortened. For layer j, there is an integer $L_j \geq \delta_j$ such that $L_j \geq n_r$. $L_j$ will be the size (in bits) of each symbol of the RS code. The field size of the RS will be $2^{L_j}$. $L_j \geq n_r$, because the length of the RS code is $n_r$, since for an RS of length N, the field size has to be at least N. According to embodiments, a minimal possible field size can be chosen, that is $L_j = \delta_j$. According to embodiments, $L_j > \delta_j$ when $n_r$ is too large for field size $2^{\delta_j}$. For example, suppose $n_r = 34$ and $\delta_j = 5$. There cannot be $L_j = 5$, because the maximal length of RS code for field size 32 is 32, which is less than 34. Note that when $\delta_j$ is large, several RS codes may be implemented for the same layer j for practical reasons to reduce field size. $RS_j$ is a (possibly shortened) RS code for layer j with dimension $k_j^{RS}$ and length $n_r$. A minimum distance of code $RS_j$ is $d_j^{RS}$. Because RS is a maximum distance separable (MDS) code, $d_j^{RS} = n_r - k_j^{RS} + 1$. According to embodiments, it is assumed that $k_2^{RS} \leq \ldots \leq k_L^{RS}$. Note that although different RS codes may be defined over different fields, they have the same length $n_r$.

According to embodiments, the following preliminaries apply for an extended parity matrix. Recall that the matrix $\Delta_{j,j-1}$ has $\delta_j$ rows. Because an RS code is defined over symbols of $L_j \geq \delta_j$, there may be a need to extend the syndrome matrices to the size that will be at least the size of the RS symbols $$\tilde{\Delta}_{j-1,j} = \begin{pmatrix} \Delta_{j-1,j} \\ ext_j \end{pmatrix},$$

where $\tilde{\Delta}_{j-1,j}$ has $L_j$ rows and $ext_j$ has $L_j - \delta_j$ rows. The code $\tilde{C}_j$ can be defined to be the code with parity check matrix $$\tilde{H}_j = \begin{pmatrix} H_1 \\ \tilde{\Delta}_{21} \\ \tilde{\Delta}_{32} \\ \vdots \\ \tilde{\Delta}_{j-1,j} \end{pmatrix}.$$

The condition is that the matrix below is full rank $$\tilde{H}_L = \begin{pmatrix} H_L \\ ext_2 \\ ext_3 \\ \vdots \\ ext_L \end{pmatrix}.$$

Because all the rows of $H_j$ appear also in $\tilde{H}_j$ it follows that the correction distance of $\tilde{C}_j$ is at least the distance of $C_j$. A decoder of $C_j$ can be sued to decode words of $\tilde{C}_j$ up to the correction capability $t_j$. The dimension of the code $\tilde{C}_j$ is given by $$\tilde{k}_j = k_j - \sum_{r=2}^{j} (L_r - \delta_r).$$

Similarly to the previous delta syndrome function for $C_j$, a syndrome can be defined for $\tilde{C}_j$ by $\tilde{\Delta}S_j(x) = \tilde{\Delta}_{j,j-1} \cdot x$.

According to an embodiment, a codeword of a large code $C_M$ is composed of blocks of $n_r$ rows, where each block has length n:

$$x = \begin{pmatrix} x_1 \\ x_2 \\ \vdots \\ x_{n_r} \end{pmatrix}.$$

The blocks of length n are denoted by $x_1, x_2, \ldots, x_{n_r}$. The blocks satisfy the following conditions: (1) All blocks are codewords of $C_1$: $x_1, x_2, \ldots, x_{n_r} \in C_1$; and (2) For each layer j, the set of the syndromes of the blocks is a codeword of the $RS_j$ code: j=2, ..., L: $(\tilde{\Delta}S_j(x_1), \ldots, \tilde{\Delta}S_j(x_{n_r})) \in RS_j$.

According to an embodiment, an undetected error (UED) is defined as follows. For a linear code C with error capability t, a vector v in the vector space is an undetected error if there is a nonzero codeword c in C such that the distance between c and v is less than the error capability.

A BCH code according to embodiments has the following properties.

The length of the code is $n_r \cdot n$.
The dimension of the code is
$k_M = k_1^{RS} + (k_2^{RS} - k_3^{RS})\tilde{k}_2 + \ldots + (k_{L-1}^{RS} - k_{L-1}^{RS})\tilde{k}_{L-1} + (n_r - k_L^{RS})\tilde{k}_L$.

A decoding capability of the code is as follows:
Define an error matrix e, similar to the definition of the code matrix:

$$e = \begin{pmatrix} e_1 \\ e_2 \\ \vdots \\ e_{n_r} \end{pmatrix}.$$

For j=2, ..., L+1, define: $\varepsilon_j(e) = |\{i | wt(e_i) \geq t_{j-1} + 1$ and $e_i$ is not UED for $C_{j-1}\}|$
where wt( ) is Hamming weight, and $\varphi_j(e) = |\{i | e_i$ is a UED for $C_{j-1}\}|$.

A decoding according to an embodiment will be successful if the following condition on the error matrix is satisfied, for j=1, ..., L:

$\varepsilon_j(e)+2\varphi_j(e) \le d_j^{RS}-1$, and $\varepsilon_{L+1}(e)=\varphi_{L+1}(e)=0$.

Encoding and Decoding the Code

Embodiments of the disclosure can find a codeword c of code $C_1$ with a predefined syndrome $\tilde{s}$, that is:

$\tilde{H}_j c=\tilde{s}$.

The syndrome $\tilde{s}$ is a vector of length $n-\tilde{k}_j$, in which the first $n-k_l$ coordinates are zero. That is, the vector is in the form:

$$\tilde{s} = \begin{pmatrix} 0 \\ s \end{pmatrix}$$

where s is a vector of length $k_1-\tilde{k}_j$.

Lemma:

For a cyclic code of length n and dimension k, any k cyclically consecutive coordinates can be taken as information symbols.

According to embodiments, there exists a square matrix $R_j$ of dimension $(n-\tilde{k}_j)(n-\tilde{k}_j)$ such that $R_j\tilde{H}_j=(A|I)$, where A is an arbitrary matrix and I is the identity matrix. The matrix $R_j$ should be be full rank, since it has an inverse matrix. The relationship $\tilde{H}_j c=\tilde{s}$ can be used to obtain an equivalent relationship:

$R_j\tilde{H}_j c=R_j\tilde{s}$.

$R_j$ can be written as:

$R_j=(Q_j|T_j)$, where Q has $n-k_l$ columns and $T_j$ has $k_1-\tilde{k}_j$ columns.

According to an embodiment, for some vector a of length $\tilde{k}_j$ and some vector b of length $n-\tilde{k}_j$, there is a vector c=(a b). Substituting everything:

$$(A|I)\begin{pmatrix} a \\ b \end{pmatrix} = (Q_j|T_j)\tilde{s} = T_j s.$$

According to an embodiment, a=0 and b=$T_j$s. This choice leads to a systematic coding, i.e., a coding that includes the information bits as well as the coded bits, described below. The length of b is $n-\tilde{k}_j$ and it follows that the codeword c may be nonzero only on the last n–

$$\tilde{k}_j = n - k_j + \sum_{r=2}^{j}(L_r - \delta_r)$$

coordinates. If c is added to a codeword in $\tilde{c} \in \tilde{C}_j$, with parity check matrix $\tilde{H}_j$, then the resulting codeword $c+\tilde{c}$ will also maintain the relationship $\tilde{H}_j c=\tilde{s}$, because the codeword $\tilde{c}$ is in $C_l$, and therefore $c+\tilde{c}$ is also in $C_l$. Since $\tilde{c} \in \tilde{C}_j$, the syndrome, with parity check matrix $\tilde{H}_j$, of $\tilde{c}$ is zero by definition, and thus the syndrome of $c+\tilde{c} \in C_1$ is $\tilde{s}$. Because codeword c may be nonzero only on the last $$n - \tilde{k}_j = n - k_j + \sum_{r=2}^{j}(L_r - \delta_r) \text{ bits,}$$

to generate $c+\tilde{c}$ from $\tilde{c}$, at most the last $$n - \tilde{k}_j = n - k_j + \sum_{r=2}^{j}(L_r - \delta_r)$$

coordinates of $\tilde{c}$ will need to be modified

Encoding $\tilde{C}_j$ with an Encoder for $C_j$

Recall that the constraint on the matrices $ext_j$ is that the following matrix is full rank:

$$\tilde{H}_L = \begin{pmatrix} H_L \\ ext_2 \\ ext_3 \\ \vdots \\ ext_L \end{pmatrix},$$

where the rows of the matrices $ext_j$ are unit vectors.

According to an embodiment, the information set of a linear code is a set of k bits such that the k information bits can be mapped into these coordinates and the projection from C is onto, which means that the columns in the generator matrix associated with the k coordinates are independent. If the matrix $ext_j$ contains unit vectors with coordinates within an information set, then encoding $\tilde{C}_j$ is as follows:

(1) Take the information vector of code $\tilde{C}_j$ and length $\tilde{k}_j$ and append zeros in the coordinates specified by the unit vectors; and (2) Encode the resulting vector of length $k_j$ with the encoder for $C_j$.

Recall that a codeword c for a predetermined syndrome may be nonzero only on the last $$n - \tilde{k}_j = n - k_j + \sum_{r=2}^{j}(L_r - \delta_r)$$

coordinates. If the forced zero coordinates for $\tilde{C}_j$ were at the end of the information for $C_j$, that is in the range $$\left\{k_j - \sum_{r=2}^{j}(L_r - \delta_r) + 1, \ldots, k_j\right\},$$

then the information coordinates $$\{1, \ldots, \tilde{k}_j\} = \left\{1, \ldots, k_j - \sum_{r=2}^{j}(L_r - \delta_r)\right\}$$

would not be affected by adding c. But for j<L, the zeros will not be forced at the end of the information, but on a different set of the same size, and therefore the information coordinates will be affected by adding c. The resulting encoding is not systematic, but the computational cost at the decoder is typically small.

Encoding for Full Rank Parity Check Matrices

Figure 10:
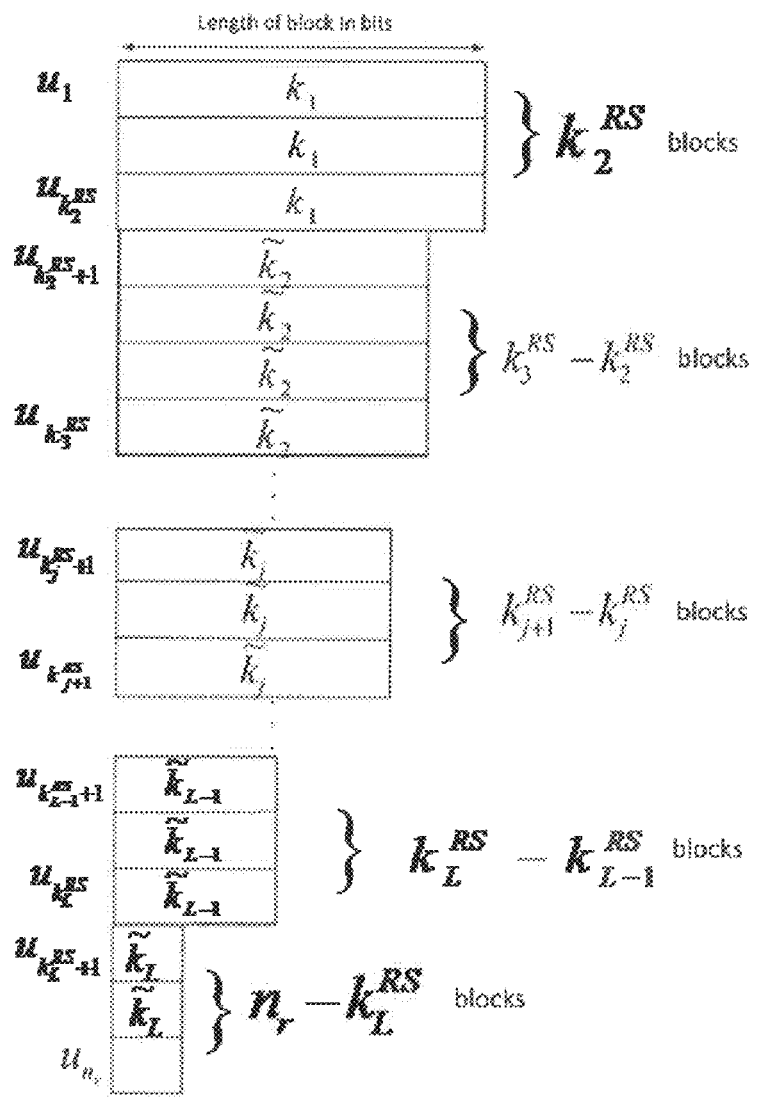
FIG. 10 illustrates the partitioning of bits of information into non-equal blocks, according to an embodiment of the disclosure.
Figure 11:
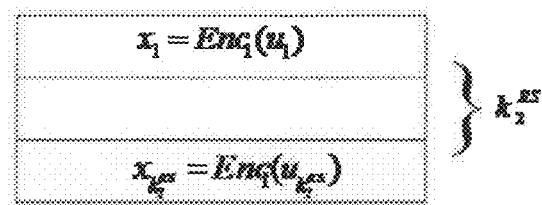
FIG. 11 illustrates the pre-computation of the first blocks of matrices $T_j$ with code $C_l$, according to an embodiment of the disclosure.
Figure 12:
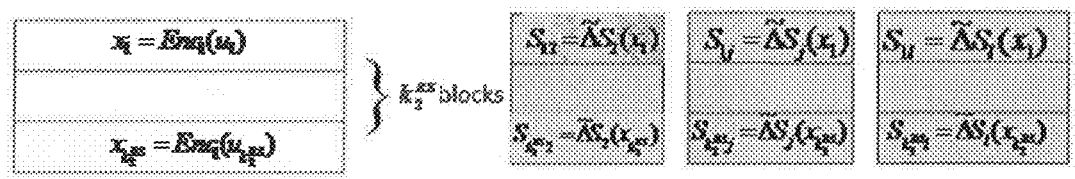
FIG. 12 illustrates the computation of syndromes for $j=2, \ldots, L$, according to an embodiment of the disclosure.
Figure 13:
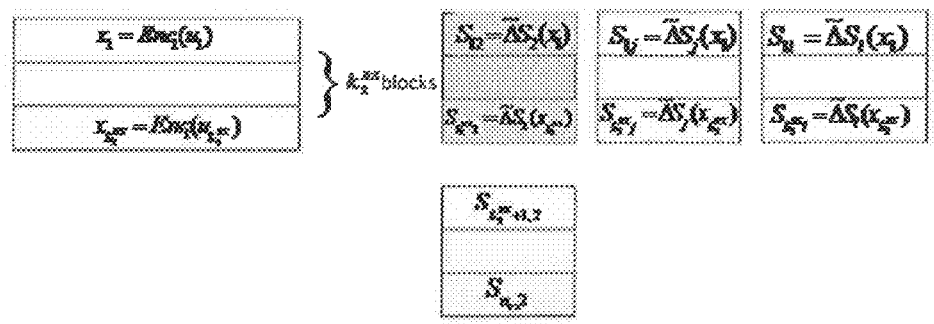
FIG. 13 illustrates the resulting $RS_2$ codeword, according to an embodiment of the disclosure.
Figure 14:
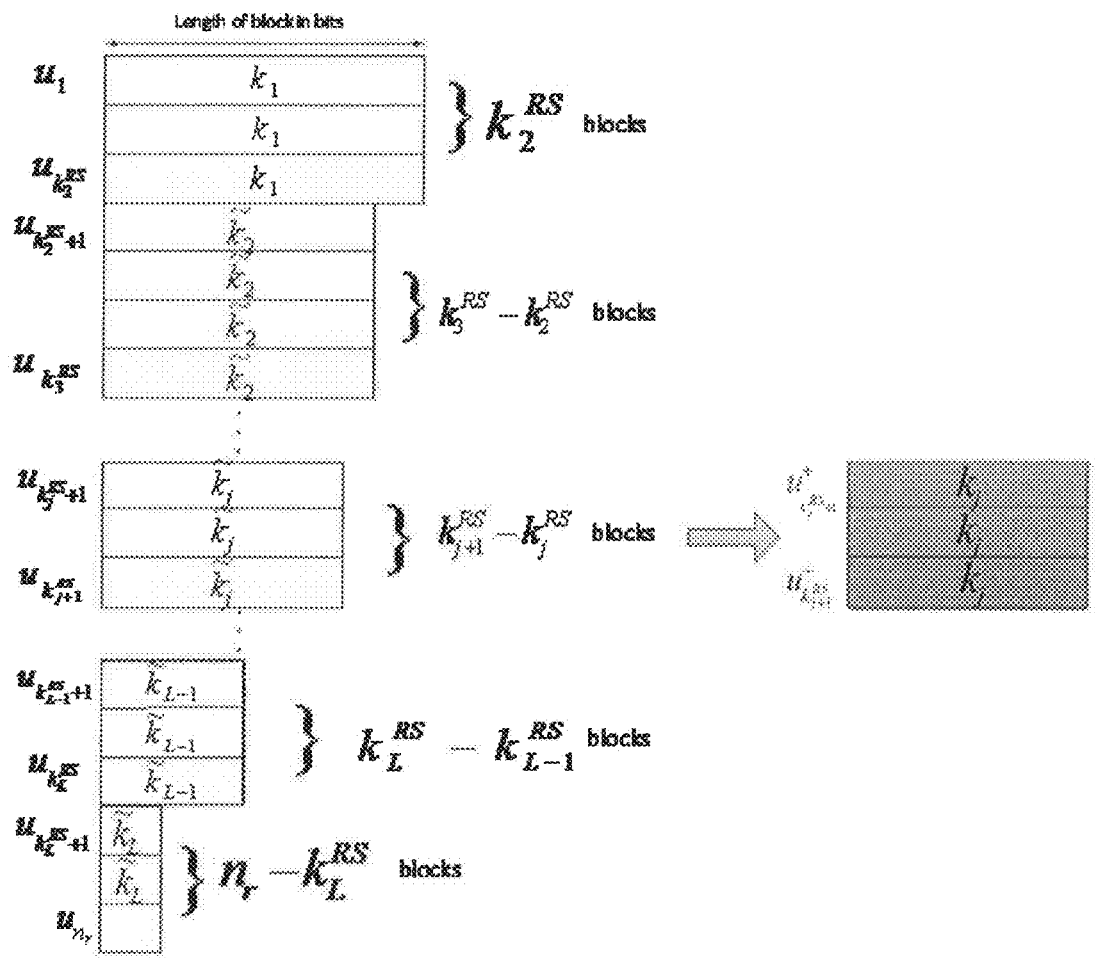
FIG. 14 illustrates the transformation of information blocks of size $\tilde{k}_j$ into blocks of size $k_j$ using zero padding, according to an embodiment of the disclosure.
Figure 15:
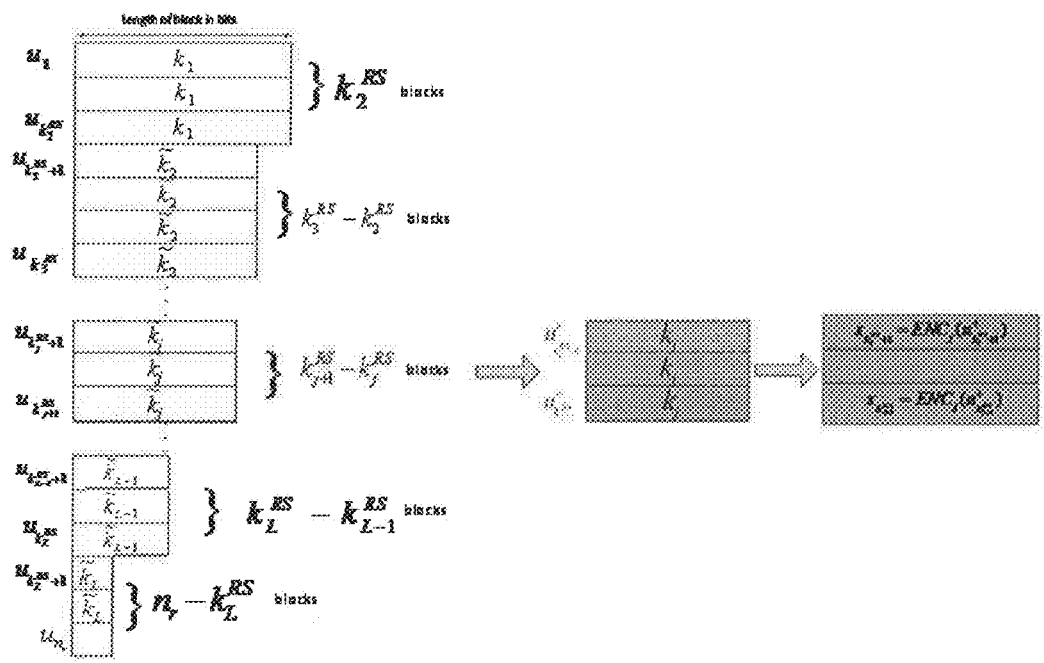
FIG. 15 illustrates the computation of codeword $x_i$ using code $C_l$, according to an embodiment of the disclosure.
Figure 16:
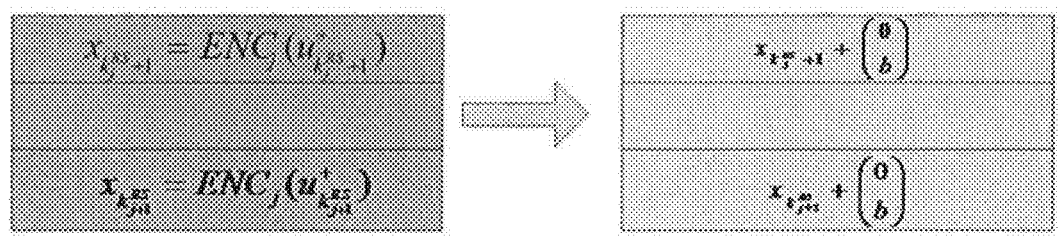
FIG. 16 illustrates the updating of the codeword x according to an embodiment of the disclosure.
Figure 17:
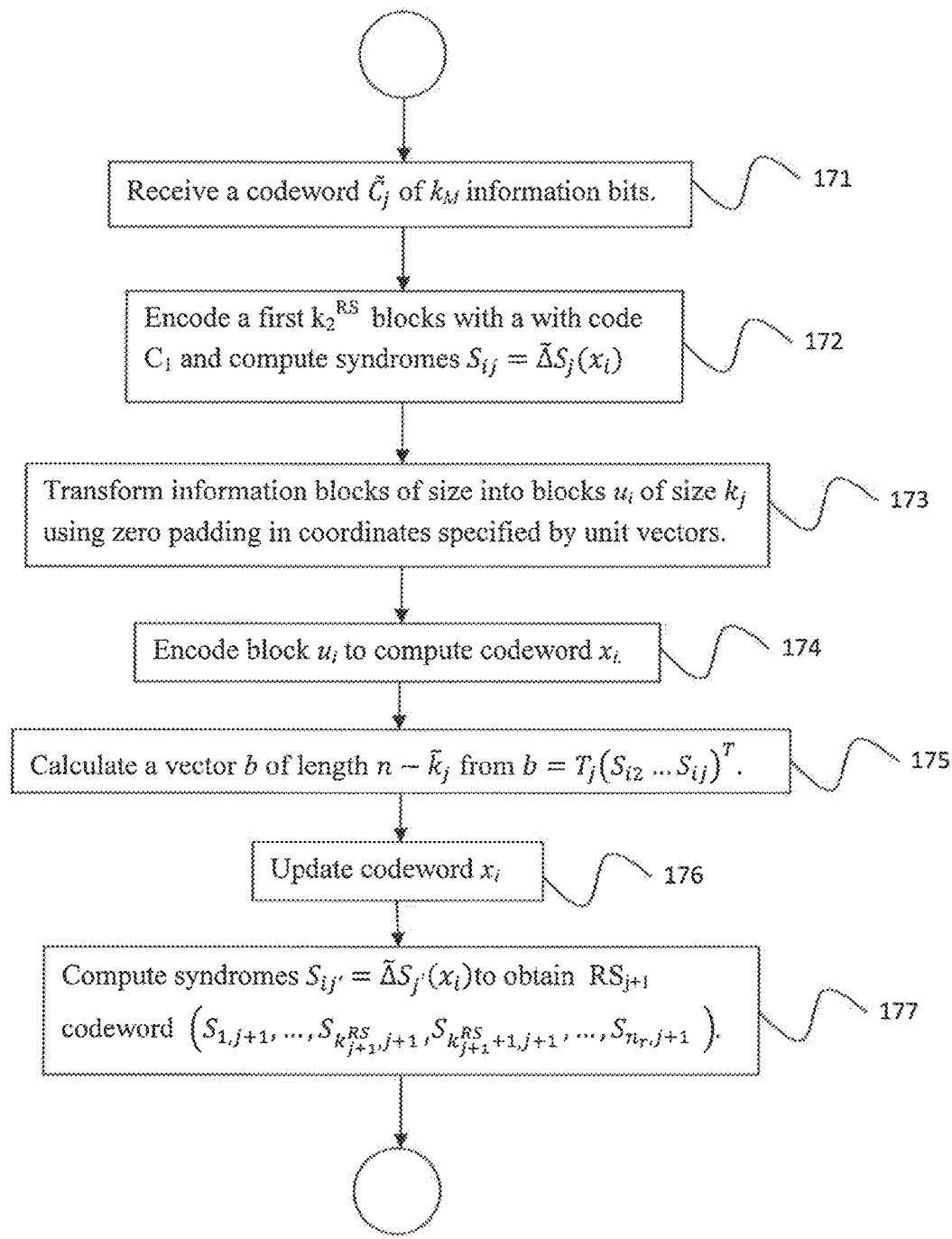
FIG. 17 is a flowchart of an encoding method according to an embodiment of the disclosure.

According to an embodiment of the disclosure, there is a systematic encoder for $C_j$, denoted by $Enc_j$. A systematic encoder is an encoder that outputs the information bits, as well as the coded bits, so that the original information bits always appear in the codeword. The encoding for $\tilde{C}_j$ can be performed using the encoder for $C_j$, as explained above, by padding zeros at the end of the information. The $k_M$ bits of information are then partitioned into non-equal blocks, as shown In FIG. 10. Referring to the figure, there are $k_{j+1}^{RS} - k_j^{RS}$ blocks of $\tilde{k}_j$ bits each. The encoder also pre-computes the matrices $T_j$, $j=2, \ldots, L$ of dimension $(n-\tilde{k}_j) \times (k_1 - \tilde{k}_j)$. An encoding algorithm according to an embodiment of the disclosure is illustrated in FIG. 17. Referring to the figure, an encoding algorithm beings by receiving Receive a codeword $\tilde{C}_j$ of $k_M$ information bits, at step 171. At step 172, for the first $K_2^{RS}$ blocks, encode $x_i = ENC_1(u_i)$ with code $C_1$, as illustrated in FIG. 11. Then, for $j=2, \ldots, L$ compute the syndromes $S_{ij} = \tilde{\Delta} S_j(x_i)$, as illustrated in FIG. 12. The vector of the syndromes $$\left( S_{12}, \ldots, S_{k_2^{RS}, 2} \right)$$

is now treated as the information to be encoded by $RS_2$, where each symbols of the vector consists $L_2$ bits (or is from an alphabet of size $2^{L_2}$). The resulting $RS_2$ codeword is given by $$\left( S_{12}, \ldots, S_{k_2^{RS}, 2}, S_{k_2^{RS}+1, 2}, \ldots, S_{n_r, 2} \right),$$

as illustrated in FIG. 13. Next, at step 173, for $j=2, \ldots, L$, for $i \in \{k_j^{RS}+1, \ldots, k_{j+1}^{RS}\}$, the information blocks of size $\tilde{k}_j$ are transformed into blocks $u_i^+$ of size $k_j$ using zero padding and as shown in FIG. 14. Then, at step 174, $x_i = ENC_i(u_i^+)$ is computed using code $C_i$, as illustrated in FIG. 15. A vector b of length $n - \tilde{k}_j$ is calculated at step 175:

$$b = T_j \begin{pmatrix} S_{i2} \\ \vdots \\ S_{i,j} \end{pmatrix},$$

and the codeword $x_i$ is updated at step 176 according to:

$$x_i \leftarrow x_i = \begin{pmatrix} 0 \\ \vdots \\ 0 \\ b \end{pmatrix} = \begin{pmatrix} x_1 \\ \vdots \\ x_{\tilde{k}_j} \\ x_{\tilde{k}_j+1} \\ \vdots \\ x_n \end{pmatrix} + \begin{pmatrix} 0 \\ \vdots \\ 0 \\ b_1 \\ \vdots \\ b_{n-\tilde{k}_j} \end{pmatrix},$$

as illustrated in FIG. 16. For $j'=j+1, \ldots, L$ the syndromes can be computed from $S_{ij'} = \tilde{\Delta} S_{j'}(x_i)$. If $j \leq L-1$, a systematic encoder $RS_{j+1}$ according to an embodiment can be used to encode the information vector of the syndromes $$\left( S_{1,j+1}, \ldots, S_{k_{j+1}^{RS}, j+1} \right)$$

into a resulting $RS_{j+1}$ codeword at step 177 given by:

$$\left( S_{1,j+1}, \ldots, S_{k_{j+1}^{RS}, j+1}, S_{k_{j+1}^{RS}+1, j+1}, \ldots, S_{n_r, j+1} \right).$$

Decoding for Full Rank Parity Check Matrices

According to an embodiment, there is a decoder for $C_j$ given by $Dec_j$ for $j=1, \ldots, L$. As in the case of the encoder, the decoder can be any standard decoder as is known in the art, such as BCH decoder or an RS decoder. According to embodiments, the inputs to the decoders are the syndromes and the output is an error vector. The input syndrome is a binary vector of length $n - k_j$, and the output is a binary error vector of length n or failure. Failure occurs when there is no codeword of distance at most $t_j$ from the received codeword. A decoder according to an embodiment can decode all error patterns defined in the properties of the code.

A decoding algorithm according to an embodiment takes as input a received binary matrix with $n_r$ rows and $n_c$ columns, where $y_i$ is given by row i, and the output is a binary vector u of length $k_M$ or failure. The vector u is a correct information vector if the error matrix has the error patterns defined in the properties of the code. If an error is detected the output is failure.

Figure 18:
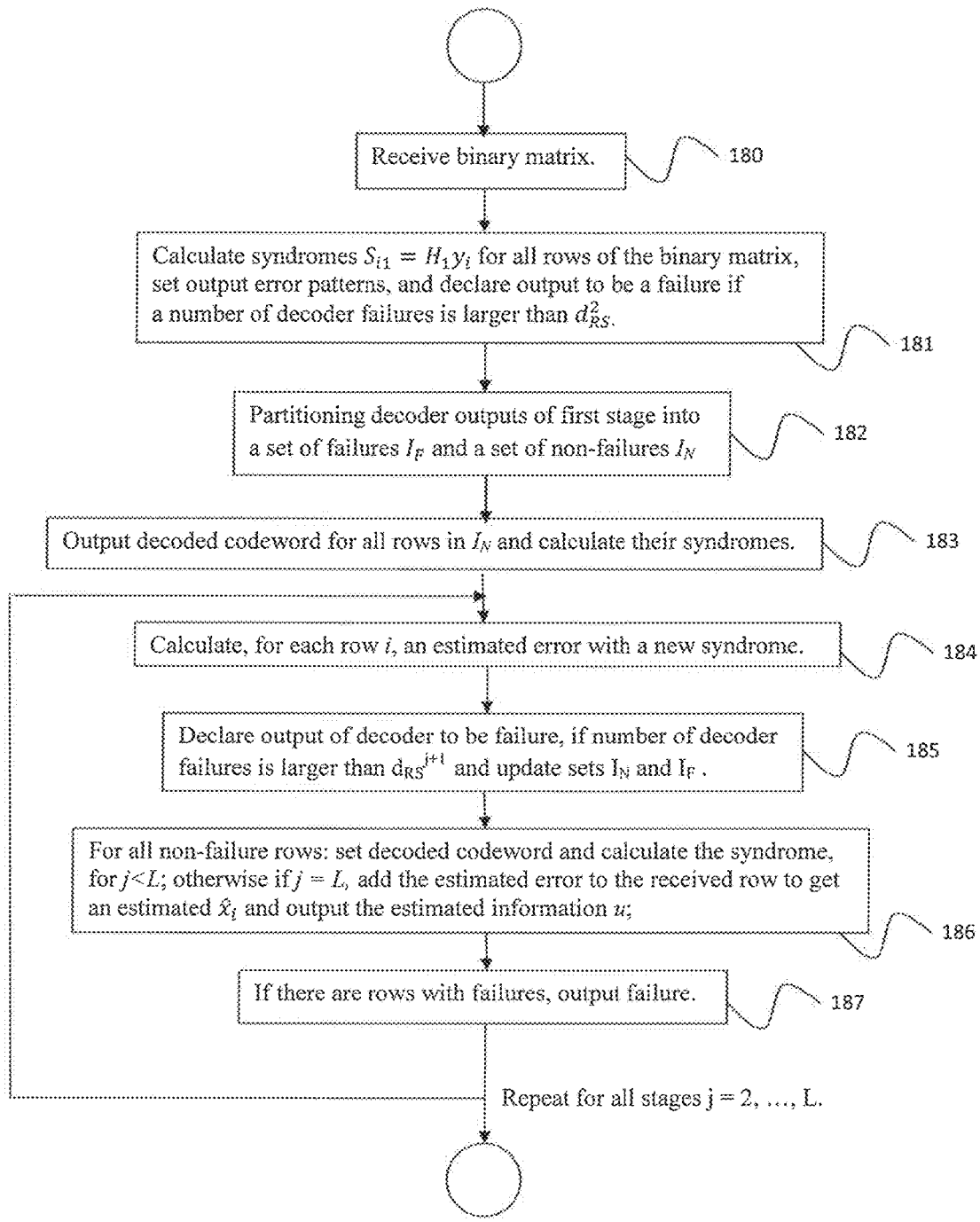
FIG. 18 is a flowchart of a decoding method according to an embodiment of the disclosure.

FIG. 18 is a flow chart of a decoding algorithm according to an embodiment of the disclosure. A decoding algorithm according to an embodiment begins at step 180 by receiving the binary matrix with $n_r$ rows and $n_c$ columns, and continues at step 181 by calculating the syndromes $S_{i1} = H_1 y_i$ for all rows $i=1, \ldots, n_r$ and set the output error patterns $\hat{e}_i = Dec_1(S_{i1})$. If the number of decoder failures is larger than $d_{RS}^2$, then the output of the decoder is failure. The outputs of the decoders of stage 1 are partitioned at step 182 into two sets: failures and non-failures:

$$I_F = \{i | \hat{e}_i = \text{failure}\},$$

$$I_N = \{i | \hat{e}_i \neq \text{failure}\}.$$

For all rows with non-failures, the decoded codeword $\hat{x}_i = y_i + \hat{e}_i$ and the syndromes $\tilde{\Delta} S_2(\hat{x}_i)$ can be calculated for all rows. If the set of syndromes is already a codeword of $RS_2$, the decoded error vectors can be added to the received rows and u can be output as the vector of information at step 183.

According to embodiments, in a general case, errors and erasures can be used for decoding for $RS_2$ with erasures on $I_F$, and the syndromes $\tilde{\Delta} S_2(\hat{x}_i)$ are recovered for all rows. If RS detects an error, declare error.

In a practical decoder according to embodiments, if the RS decoder corrected an error at a certain row in $I_N$, then that row is considered to be in $I_F$. Then, for all i, i.e., for rows in $I_F$, the last $L_i - \delta_i$ entries of $\tilde{\Delta} S_2(\hat{x}_i)$ are deleted to get $\Delta S_2(\hat{x}_i)$, $\Delta S_2(y_i)$ is calculated, and $\Delta S_2(\hat{e}_i) = \Delta S_2(y_i) + \Delta S_2(\hat{x}_i)$ is calculated, after which there is $S_{i2} = H_2 \hat{e}_i$ for all rows.

Referring again to FIG. 18, a decoding algorithm continues, for stages $j=2, \ldots, L$, at step 184 by, for each row i, calculating the estimated error with the new syndrome $\hat{e}_i = Dec_j(S_{ij})$. If, at step 185, the number of decoder failures is larger than $d_{RS}^{j+1}$, the output of the decoder is declared to be failure (in the last stage no failures are allowed), and sets $I_N$ and $I_F$ are updated. At step 186, for all rows with non-failures, the decoded codeword is $\hat{x}_i = y_i + \hat{e}_i$, and if $j < L$, the syndrome $\tilde{\Delta S}_{j+1}(\hat{x}_i)$ is calculated, otherwise if j=L, the estimated error is added to the received row to get an estimated $\hat{z}_i$ and the estimated information u is output. If, at step 187, there are still rows with failures, output failure.

In a practical decoder according to embodiments, if the RS decoder corrected an error at a certain row in $I_N$, then that row is considered to be in $I_F$. Then, for all i, the last $L_i - \delta_i$ entries of $\tilde{\Delta S}_{j+1}(\hat{x}_i)$ are deleted to get $\Delta S_{j+1}(\hat{x}_i)$, $\Delta S_{j+1}(y_i)$ is calculated, and $\tilde{\Delta S}_{j+2}(e_i) = \tilde{\Delta S}_{j+1}(y_i) + \Delta S_{2j+2}(\hat{x}_i)$ is calculated. According to an embodiment, there are now $S_{i,j+1} = H_{j+1} \hat{e}_i$ for all rows. Steps 184 to 187 are repeated for all stages j=2, ..., L.

Encoding and Decoding for BCH Components

According to embodiments, for some codes, the matrix $H_i$ is not full rank. A decoding algorithm according to an embodiment of the disclosure includes decoding of BCH components with some modifications. Specifically, consider a t-error correcting primitive binary BCH code C of length $n=2^{m}-1$ Assume $\alpha$ is a primitive of the field of size $2^m$) and that the parity check matrix is given by, $$H = \begin{pmatrix} 1 & \alpha & \cdots & \alpha^{n-1} \\ 1 & \alpha^3 & \cdots & \alpha^{3(n-1)} \\ 1 & \vdots & \vdots & \vdots \\ 1 & \alpha^{2t-1} & \cdots & \alpha^{(2t-1)(n-1)} \end{pmatrix},$$

where each element from the field is considered as a binary column vector of length m. H may not be full rank. BM decoding requires a syndrome with respect to Has input. For an algorithm according to an embodiment to work, the matrix H should be full rank, otherwise it will not necessarily be possible in the encoding to find a codeword with a pre-determined syndrome.

According to embodiments, a fixed subset of rows of H that are a basis of the row space will be used, and denote the resulting parity check matrix by H'. The missing bits of the syndrome, which are rows in H that do not appear in H', can be obtained as fixed linear combinations of existing syndrome bits. According to embodiments, there are only minor modifications in the encoding and decoding. For the parity check matrix, $H_i=(1 \; \alpha^{ij} \; \alpha^{i2j} \; \ldots \; \alpha^{i(n-1)j})$, the code is generated by $P_{\alpha^i}(x)$, which is the minimal polynomial of $\alpha^i$ over the binary field. The dimension of the code is n–deg $(P_{\alpha^i})$, and the rank of $H_i$ is rank$(H_i)$=deg $(P_{\alpha^i})$.

According to an embodiment, consider the parity check matrix H:

$$H = \begin{pmatrix} 1 & \alpha^{i_1} & \cdots & \alpha^{i_1(n-1)} \\ 1 & \alpha^{i_2} & \cdots & \alpha^{i_2(n-1)} \\ 1 & \vdots & \vdots & \vdots \\ 1 & \alpha^{i_p} & \cdots & \alpha^{i_p(n-1)} \end{pmatrix}$$

where $I=\{i_1, i_2 \ldots i_p\} \subseteq \{1, 2, \ldots, 2t-1\}$. The generator polynomial is $g_I(x) = LCM(P_{\alpha^i}(x) | i \in I)$, and the code dimension is n–deg $(g_I(x))$. If $\alpha^i$ and $\alpha^j$ have the same generator polynomial (i.e., are conjugate), then the rows of $H_i$, when regarded as binary matrix, and $H_j$ span the same space. If there is a set of elements I such that each element has a different minimal polynomial, then $$\sum_{i \in I} deg(P_{\alpha^i}) = \sum_{i \in I} rank(H_i)$$

H' can be obtained by taking for each element with distinct minimal polynomial, but not in the same set of conjugates: $H_i$, if the degree of the minimal polynomial is m, or $H'_i$ with rank$(H_i)$=deg$(P_{\alpha^i})$ rows, if the degree of the minimal polynomial is smaller than m, which may occur only if m is not prime. According to an embodiment, to find the syndrome $H_x$ for some binary vector x of length n, given the shortest syndrome $H'_x$, one of the following methods can be used:

(1) Complete the missing entries for all i with minimal polynomial with degree smaller than m by multiplying the syndrome $H'_x$ with an appropriate matrix $M_i$; or (2) For all i that is not the smallest in the set of conjugates, the syndrome can be calculated by repeatedly squaring the syndrome of the smallest element in the set, similar to the way even syndromes are calculated from odd syndromes in BM decoding.

Cyclic Codes Property

According to embodiments, for a vector $x=(x_1, \ldots, x_n) \in F^n$, the value $L(x)=\max\{1 \leq j \leq n: x_j \neq 0\}$, for the zero vector define $L(0)=0$, the highest nonzero coordinate.

Lemma:

For a parity check matrix H with size r×n over field F=GF(q) of a cyclic code C, if s is the rank of H, then the first s columns of H are linearly independent.

An algorithm according to an embodiment of the disclosure is as follows. Fix $m \geq 1$ and $n \leq 2^m - 1$ and t a positive integer, field $F=GF(2^m)$ and let a be a primitive of the field. Consider the BCH check matrix:

$$H = \begin{pmatrix} 1 & \alpha & \cdots & \alpha^{n-1} \\ 1 & \alpha^3 & \cdots & \alpha^{3(n-1)} \\ 1 & \vdots & \vdots & \vdots \\ 1 & \alpha^{2t-1} & \cdots & \alpha^{(2t-1)(n-1)} \end{pmatrix}.$$

Suppose, for the time being, that H is full ranked with rank t. Now, set r=t·m, the size of the BCH redundancy. Note that by the lemma, for every vector $w \in F^r$, there exists a unique binary vector v of length n such that H·v=w and $L(v) \leq r$.

According to an embodiment, fix integer t', t>t'≥1. The input of an algorithm according to an embodiment is a general vector $w \in F^t$, whose first t' coordinates, each comprising m bits, are zero. An output of an algorithm according to an embodiment is the unique binary vector v of length n such that H·v=w and $L(v) \leq r$.

Consider the m unit vectors of F viewed as in dimensional vector of the linear space $GF(2)^m$:

$$e_j = \begin{pmatrix} 0 \\ \vdots \\ 1 \\ \vdots \\ 0 \end{pmatrix} \leftarrow \text{index } j,$$

which corresponds to $\alpha^j$. Similarly, consider the zero vector of F as an m dimensional zero vector $$0_F = \begin{pmatrix} 0 \\ \vdots \\ 0 \\ \vdots \\ 0 \end{pmatrix} \leftarrow \text{index } m.$$

Take t″, where t′<t″≤t, and 1≤j≤m, and define a unit vector in $F^t$:

$$\omega_{t'',j} = \begin{pmatrix} 0_F \\ \vdots \\ e_j \\ \vdots \\ 0_F \end{pmatrix} \leftarrow \text{index } t''.$$

Figure 20:
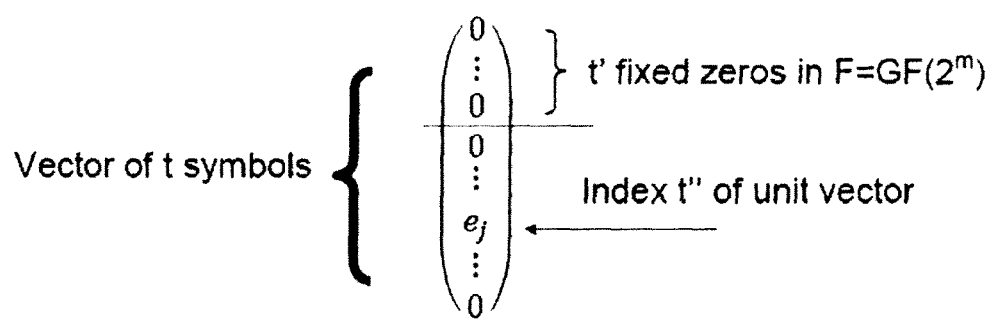

Similarly to before, for each j and t″, there exists a unique binary vector $u_{t''j}$ no of length n such that $L(u_{t''j}) \leq r$ and $H \cdot u_{t''j} = \omega_{t''j}$. According to embodiments, the set $\{u_{t''j}\}$ is referred to as a unit-vectors-solution. For a general vector w, take a sum of unit-vector-solutions as shown in FIG. 20.

Unit-Vectors-Solutions Expressed as Polynomial Products

According to embodiments, unit-vectors-solutions can be expressed as polynomial products. For every 1≤t″≤t, let $g_{t''}(x)$ be the polynomial of degree m with coefficients in GF(2) which is the minimal polynomial of $\alpha^{t''}$. Define for 1≤t″≤t:

$$G_{t''}(x) = \Pi_{1 \leq s \leq t, s \neq t''} g_s(x),$$

which corresponds to all indices except the one of the unit vector, $$G^Z(x) = \Pi_{1 \leq s \leq t'} g_s(x),$$

which corresponds to all zero indices in the beginning of the vector, and $$G_{t''}^N(x) = \Pi_{t' < s \leq t, s \neq t''} g_s(x),$$

which corresponds to all indices after the first t′ zero indices, except the one of the unit vector. Then, $G_{t''}(x) = G^Z(x) G_{t''}^N(x)$ and $\deg(G_{t''}(x)) = m \cdot (t-1)$, $\deg(G^Z(z)) = m \cdot t'$, $\deg(G_{t''}^N(x)) = m \cdot (t-t'-1)$.

According to embodiments, for unit vector solution $u_{t''j} = (u_{t''j,1}, \ldots, u_{t''j,n})$, define a polynomial $$U_{t''j}(x) = \Sigma_{1 \leq k \leq n} u_{t''j,k} x^{k-1}.$$

Because $L(u_{t''j}) \leq r$, it follows that this is a polynomial of degree ≤r−1. According to a definition of unit vector solution, $U_{t''j}(\alpha^s) = 0$ for all 1≤s≤t, s≠t″. It follows that $G_{t''}(x) | U_{t''j}(x)$. Thus, there exists a unique polynomial $h_{t''j}(x)$ with coefficients in GF(2) such that $$h_{t''j}(x) \cdot G_{t''}(x) = U_{t''j}(x),$$

where $\deg(h_{t''j}(x)) \leq r-1-m \cdot (t-1) = mt-1-mt+m = m-1$.

According to an embodiment, the memory needed for an algorithm according to an embodiment is as follows. Store in memory $G^Z(x)$, $\{G_{t''}^N(x): t' < t'' \leq t\}$ and $\{h_{t''j}(x): t' < t'' \leq t, 1 \leq j \leq m\}$ and recall that $\deg(G_{t''}^N(x)) = m \cdot (t-t'-1)$. Thus the memory comprises B bits, where $B = m \cdot t' + (t-t') \cdot ((t-t'-1) \cdot m + m^2)$.

General Vector Input

According to an embodiment, a general vector input is as follows. Take an arbitrary vector $w = (w_1, \ldots, w_t) \in F^t$. w can be written as a sum of unit vectors:

$$w = \Sigma_{t' \leq t'' \leq t, 1 \leq j \leq m} a_{t''j} \omega_{t''j},$$

where $a_{t''j}$ are binary bits comprising the coordinates of w. The output of an algorithm according to an embodiment can be written as a sum of unit-vectors-solutions:

$$w = \Sigma_{t' \leq t'' \leq t, 1 \leq j \leq m} a_{t''j} \omega_{t''j} = \Sigma_{t' \leq t'' \leq t, 1 \leq j \leq m} a_{t''j} H u_{t''},$$
$$j = H \Sigma_{t' \leq t'' \leq t, 1 \leq j \leq m} a_{t''j} u_{t''j}.$$

For t′<t″≤t, define $$v_{t''} = \sum_{1 \leq j \leq m} a_{t'',j} u_{t'',j}$$

and $$v = \sum_{1 \leq j \leq m} v_{t''}$$

Then: $v_{t''} \in GF(2)^n$, $L(v_{t''}) \leq r$, and $$w = H \Sigma_{t' \leq t'' \leq t} v_{t''} = Hv.$$

Write a polynomial V(x) as product and sum of polynomials: For t′<t″≤t, $V_{t''}(x) = \Sigma_{1 \leq k \leq n} v_{t'',k} x^{k-1}$ is the polynomial corresponding to $v_{t''}$. The polynomial corresponding to v is:

$$V(x) = \Sigma_{t' < t'' \leq t} V_{t''}(x).$$

Then, it holds for t′<t≤t* that $$V_{t''}(x) = \sum_{1 \leq j \leq m} a_{t'',j} U_{t'',j}(x) =$$
$$\sum_{1 \leq j \leq m} a_{t'',j} h_{t'',j}(x) \cdot G_{t''}(x) = G_{t''}(x) \sum_{1 \leq j \leq m} a_{t'',j} h_{t'',j}(x) =$$
$$G^Z(x) G_{t''}^N(x) \sum_{1 \leq j \leq m} a_{t'',j} h_{t'',j}(x) = G^Z(x) W_{t''}(x)$$

where $$W_{t''}(x) = G_{t''}^N(x) \sum_{1 \leq j \leq m} a_{t'',j} h_{t'',j}(x).$$

Recall that $h_{t''j}(x)$ are polynomials of degree≤m−1 that are stored in memory. Thus, with $m^2$ XOR operations, the function $f_{t''}(x)$ can be computed:

$$f_{t''}(x) = \Sigma_{1 \leq j \leq m} a_{t''j} h_{t''j}(x).$$

With an additional $m^2 \cdot (t-t'-1)$ XORS, $W_{t''}(x)$ of degree m(t−t′) can be computed:

$$W_{t''}(x) = G_{t''}^N(x) f_{t''}(x)$$

It follows that $S = \{W_{t''}(x)\} t' < t'' \leq t$ can be computed with $m^2 \cdot (t-t')^2$ XOR operations.
In addition $$V(x) = \sum_{t' < t'' \leq t} V_{t''}(X) = \sum_{t' < t'' \leq t} G^Z(x) W_{t''}(x) = G^Z(x) \sum_{t' < t'' \leq t} W_{t''}(x)$$

of degree m·t. After computing S, compute $$W(x) = \sum_{t' < t'' \leq t} W_{t''}(x)$$

with an additional $m \cdot (t-t')^2$ XOR's and V(x) with a further $m^2 \cdot t'(t-t')$ XORs operations. According to an embodiment, an upper bound to the number of XORs required for the computation of V(x) is $C=m^2 \cdot t \cdot (t-t'+1)$.

According to embodiment, complexity can be reduced with added memory. When two polynomials in GF(2)[x]

$$f(x) = \sum_{i=0}^{M} a_i x^i$$

$$g(x) = \sum_{i=0}^{N} b_i x^i$$

are stored in memory, their product requires M×N XORs. Consider a third polynomial $$h(x) = \sum_{i=0}^{N} x^i.$$

The product $h(x) \cdot f(x)$ is computable with 2(M+N) XORS. Once $h(x), \cdot f(x)$ are given, compute $f(x) \cdot g(x)$ if ham(g(x)) ≤N/2 with M×N/2 XORs, or $f(x) \cdot g(x) = f(x) \cdot (g(x)+h(x))+h(x) \cdot f(x)$, if ham(g(x))≤N/2 using M×N/2+M+N XORs. $h(x) \cdot f(x)$ can be stored in memory to further reduce the complexity.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 19:
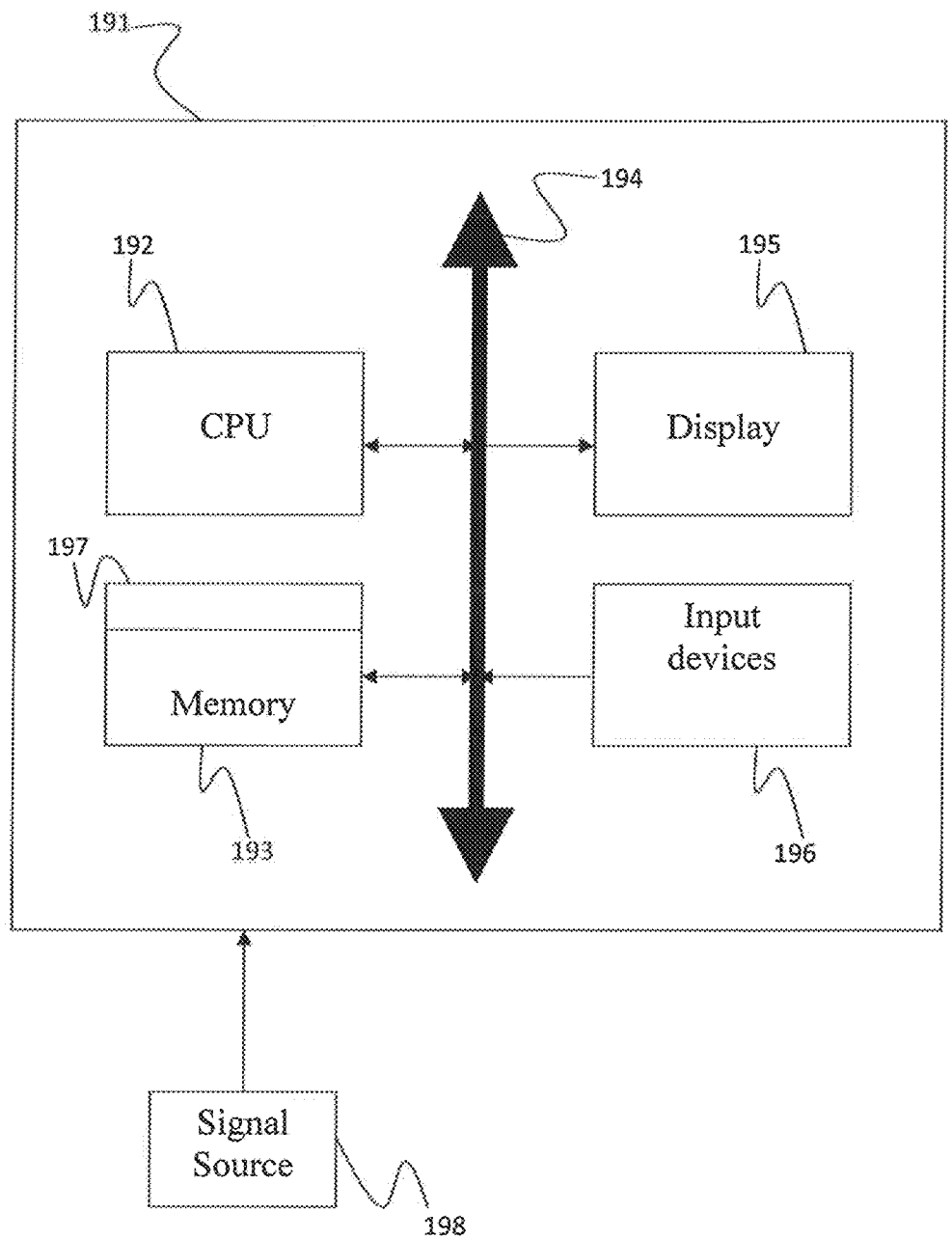
FIG. 19 is a block diagram of a machine for encoding and decoding BCH codes tailored for a RAID, according to an embodiment of the disclosure.

FIG. 19 is a block diagram of a of a machine for encoding and decoding BCH codes tailored for a RAID, according to an embodiment of the disclosure. Referring now to FIG. 19, a computer system 191 for implementing the present invention can comprise, inter alia, a central processing unit (CPU) 192, a memory 193 and an input/output (I/O) interface 194. The computer system 191 is generally coupled through the I/O interface 194 to a display 195 and various input devices 196 such as a mouse and a keyboard. The support circuits can include circuits such as cache, power supplies, clock circuits, and a communication bus. The memory 193 can include random access memory (RAM), read only memory (ROM), disk drive, tape drive, etc., or a combinations thereof. The present disclosure can be implemented as a routine 197 that is stored in memory 193 and executed by the CPU 192 to process the signal from the signal source 198. As such, the computer system 191 is a general purpose computer system that becomes a specific purpose computer system when executing the routine 197 of the present invention. Alternatively, as described above, embodiments of the present disclosure can be implemented as an ASIC or FPGA 197 that is in signal communication with the CPU 192 to process the signal from the signal source 198.

The computer system 191 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

The invention claimed is:

1. A computer implemented method of encoding generalized concatenated error-correcting codes, comprising the steps of:

receiving a codeword $\tilde{C}_j$ comprising $n_r$ rows, wherein $n_r >= 1$, of n bits each with $k_M$ information bits, $k_M < n$, $n >= 1$, wherein codeword $\tilde{C}_j$ is a code with parity check matrix $$H_j = \begin{pmatrix} H_1 \\ \tilde{\Delta}_{21} \\ \tilde{\Delta}_{32} \\ \vdots \\ \tilde{\Delta}_{j-1,j} \end{pmatrix}$$

wherein matrix $H_1$ is the parity check matrix of code $C_1$, matrix $$\tilde{\Delta}_{j-1,j} = \begin{pmatrix} \tilde{\Delta}_{j-1,j} \\ ext_j \end{pmatrix},$$

where $\tilde{\Delta}_{j-1,j}$ has $L_j$ rows and $ext_j$ has $L_j - \delta_j$ rows, and matrix $\Delta_{j-1,j}$ represents the additional checks for codewords in $C_j$ that are not in $C_{j-1}$ and has $\delta_j$ rows;

partitioning the $k_M$ information bits into $n_r$ blocks, wherein each layer comprises $k_{j+1}^{RS} - k_j^{RS}$ blocks of $\tilde{k}_j$ bits each for j=2, ..., L, wherein L is a number of layers of weak (BCH) code $C_1$, wherein each layer, except for a first layer, comprises a Reed Solomon (RS) stage followed by a BCH code, and the first layer includes only a BCH code, and $\tilde{k}_j$ is a dimension of codeword $\tilde{C}_j$;

encoding a first $k_2^{RS}$ blocks with a code $C_1$ and computing syndromes $S_{ij} = \Delta S_j(x_i)$ wherein a vector of syndromes $$\left( S_{12}, \ldots, S_{k_2^{RS},2} \right)$$

is information encoded by Reed Solomon code $RS_2$, wherein a resulting $RS_2$ codeword is given by $$\left(S_{12}, \ldots, S_{k_2^{RS},2}, S_{k_2^{RS}+1,2}, \ldots, S_{n_r,2}\right);$$

transforming information blocks of size $\tilde{k}_j$, for $j=2, \ldots, L$ and $i \in \{k_j^{RS}+1, \ldots, k_{j+1}^{RS}\}$ into blocks $u_i$, $i=1$ to $n_r$, of size $k_j$ using zero padding in coordinates specified by unit vectors;

encoding block $u_i$ with an encoder for $C_j$ to compute codeword $x_i$;

calculating a vector $b$ of length $n-\tilde{k}_j$ from $$b = T_j \begin{pmatrix} S_{i2} \\ \vdots \\ S_{i,j} \end{pmatrix},$$

wherein matrix $T_j$ is defined by $R_j=(Q_j|T_j)$, where Q has $n-k_l$ columns, $T_j$ has $k_1-\tilde{k}_j$ columns, and $R_j$ is a square matrix of dimension $(n-\tilde{k}_j)(n-\tilde{k}_j)$ such that $R_j \tilde{H}_j=(A|I)$, wherein A is a arbitrary matrix, I is an identity matrix, $\tilde{H}_j$ is a parity matrix of codeword $\tilde{C}_j$;

updating codeword $x_i$ according to $$x_i \leftarrow x_i + \begin{pmatrix} 0 \\ M \\ 0 \\ b \end{pmatrix} = \begin{pmatrix} x_1 \\ M \\ x_{\tilde{k}_j} \\ x_{\tilde{k}_j+1} \\ M \\ x_n \end{pmatrix} + \begin{pmatrix} 0 \\ M \\ 0 \\ b_1 \\ M \\ b_{n-\tilde{k}_j} \end{pmatrix};$$

and computing syndromes $s_{ij'}=\tilde{\Delta}S_j(x_i)$ for $j'=j+1, \ldots, L$, wherein a resulting $RS_{j+1}$ codeword is given by $$\left(S_{1,j+1}, \ldots, S_{k_{j+1}^{RS},j+1}, S_{k_{j+1}^{RS}+1,j+1}, \ldots, S_{n_r,j+1}\right) \text{ for } j <= L-1.$$

2. The method of claim 1, further comprising, if parity matrix $\tilde{H}_j$ is not a full rank matrix, calculating a full rank parity matrix $H'_j$ from one of $\tilde{H}_j$ if a degree of a minimum polynomial for each element is m, wherein m is defined from a length n of a primitive binary BCH code associated with said parity matrix $\tilde{H}_j$ by $n=2^{m-1}$, and $H'_i$ with $\text{rank}(H_i)=\deg(P_{\alpha^i})$ rows if the degree of the minimal polynomial is less than m, wherein $P_{\alpha^i}(x)$ is the minimal polynomial of $\alpha^i$ over the binary field and a generator polynomial of $\tilde{H}_j$ is $g_i(x) = \text{LCM}(P_{\alpha^i}(x)|i \in I)$.

3. A computer implemented method of encoding generalized concatenated error-correcting codes, comprising the steps of:

providing a parity matrix $\tilde{H}_j$ of a j-th layer code and predefined syndrome $\tilde{s}$, wherein syndrome $\tilde{s}$ is a vector $$\tilde{s} = \begin{pmatrix} 0 \\ s \end{pmatrix}$$

of length $n-\tilde{k}_j$, in which the first $n-k_l$ coordinates are zero, wherein s is a vector of length $k_1-\tilde{k}_j$, wherein n is a length of a codeword c of a first layer (BCH) code $C_l$ of dimension $\tilde{k}_j$, wherein codeword c satisfies $\tilde{H}_j c = \tilde{s}$, wherein a first layer code includes only a BCH code, and each subsequent layer includes a Reed-Solomon (RS) stage followed by a BCH code;

finding a square matrix $R_j$ of dimension $(n-\tilde{k}_j)(n-\tilde{k}_j)$ such that $R_j\tilde{H}_j=(A|I)$, wherein A is an arbitrary matrix and I is the identity matrix, wherein $R_j=(Q_j|T_j)$, where Q has $n-k_l$ columns and $T_j$ has $k_1-\tilde{k}_i$ columns;

finding a vector $c=(a\ b)$ wherein a is a vector of length $\tilde{k}_j$ and b is a vector of length $n-\tilde{k}_j$; and solving $$(A | I)\begin{pmatrix} a \\ b \end{pmatrix} = (Q_j | T_j)\tilde{s} = T_j s \text{ where } a = 0 \text{ and } b = T_j s,$$

wherein $a=0$ and $b=T_j s$, wherein codeword c is nonzero only on the last $n-\tilde{k}k_j=n-\tilde{k}_j$ bits.

4. A computer processor configured to execute a program of instructions to perform the method steps for encoding generalized concatenated error-correcting codes, the method comprising the steps of:

receiving a codeword $\tilde{C}_j$ comprising $n_r$ rows, wherein $n_r>=1$, of n bits each with $k_M$ information bits, $k_M<n$, $n>=1$, wherein codeword $\tilde{C}_j$ is a code with parity check matrix $$\tilde{H}_j = \begin{pmatrix} H_1 \\ \tilde{\Delta}_{21} \\ \tilde{\Delta}_{32} \\ \vdots \\ \tilde{\Delta}_{j-1,j} \end{pmatrix}$$

wherein matrix $H_1$ is the parity check matrix of code $C_1$, matrix $$\tilde{\Delta}_{j-1,j} = \begin{pmatrix} \Delta_{j-1,j} \\ ext_j \end{pmatrix},$$

where $\tilde{\Delta}_{j-i,j}$ has $L_j$ rows and $ext_j$ has $L_j-\delta_j$ rows, and matrix $\Delta_{j-1,j}$ represents the additional checks for codewords in $C_j$ that are not in $C_{j-1}$ and has $\delta_j$ rows;

partitioning the $k_M$ information bits into $n_r$ blocks, wherein each layer comprises $k_{j+1}^{RS}-k_j^{RS}$ blocks of $\tilde{k}_j$ bits each for $j=2, \ldots, L$, wherein L is a number of layers of weak (BCH) code $C_1$, wherein each layer, except for a first layer, comprises a Reed Solomon (RS) stage followed by a BCH code, and the first layer includes only a BCH code, and $\tilde{k}_j$ is a dimension of codeword $\tilde{C}_j$;

encoding a first $k_2^{RS}$ blocks with a code $C_1$ and computing syndromes $S_{ij}=\tilde{\Delta}S_j(x_i)$ wherein a vector of syndromes $$\left(S_{12}, \ldots, S_{k_2^{RS},2}\right)$$

is information encoded by Reed Solomon code $RS_2$, wherein a resulting $RS_2$ codeword is given by $$\left(S_{12}, \ldots, S_{k_2^{RS},2}, S_{k_2^{RS}+1,2}, \ldots, S_{n_r,2}\right);$$

transforming information blocks of size $\tilde{k}_j$, for $j=2, \ldots, L$ and $i \in \{k_j^{RS}+1, \ldots, k_{j+1}^{RS}\}$ into blocks $u_i$, $i=1$ to $n_r$, of size $k_j$ using zero padding in coordinates specified by unit vectors;

encoding block $u_i$ with an encoder for $C_j$ to compute codeword $x_i$;

calculating a vector b of length $n-\tilde{k}_j$ from $$b = T_j \begin{pmatrix} S_{i2} \\ \vdots \\ S_{ij} \end{pmatrix},$$

wherein matrix $T_j$ is defined by $R_j=(Q_j|T_j)$, where Q has $n-k_1$ columns, $T_j$ has $k_1-\tilde{k}_j$ columns, and $R_j$ is a square matrix of dimension $(n-\tilde{k}_j)(n-\tilde{k}_j)$ such that $R_j\tilde{H}_j=(A|I)$, wherein A is an arbitrary matrix, I is an identity matrix, $\tilde{H}_j$ is a parity matrix of codeword $\tilde{C}_j$;

updating codeword $x_i$ according to $$x_i \leftarrow x_i + \begin{pmatrix} 0 \\ M \\ 0 \\ b \end{pmatrix} = \begin{pmatrix} x_1 \\ M \\ x_{\tilde{k}_j} \\ x_{\tilde{k}_j+1} \\ M \\ x_n \end{pmatrix} + \begin{pmatrix} 0 \\ M \\ 0 \\ b_1 \\ M \\ b_{n-\tilde{k}_j} \end{pmatrix};$$

and computing syndromes $S_{ij'}=\tilde{\Delta}S_{j'}(x_i)$ for $j'=j+1, \ldots, L$, wherein a resulting $RS_{j+1}$ codeword is given by $$\left(S_{1,j+1}, \ldots, S_{k_{j+1}^{RS},j+1}, S_{k_{j+1}^{RS}+1,j+1}, \ldots, S_{n_r,j+1}\right) \text{ for } j <= L-1.$$

5. The computer processor of claim 4, the method further comprising, if parity matrix $\tilde{H}_j$ is not a full rank matrix, calculating a full rank parity matrix $H'_j$ from one of $\tilde{H}_j$ if a degree of a minimum polynomial for each element is m, wherein m is defined from a length n of a primitive binary BCH code associated with said parity matrix $\tilde{H}_j$ by $n=2^{m-1}$, and $H'_j$ with $\text{rank}(H_i)=\deg(P_{\alpha^i})$ rows if the degree of the minimal polynomial is less than m, wherein $P_{\alpha^i}(x)$ is the minimal polynomial of $\alpha^i$ over the binary field and a generator polynomial of $\tilde{H}_j$ is $g_1(x)=\text{LCM}(P_{\alpha^i}(x)|t \in I)$.

6. The computer processor of claim 4, wherein the computer processor is one or more of an application specific integrated circuit (ASIC), a field programmable gate array (FPGA), or firmware.

\* \* \* \* \*